(12) United States Patent
Gou et al.

(10) Patent No.: US 8,717,217 B2
(45) Date of Patent: May 6, 2014

(54) ANALOG-TO-DIGITAL CONVERTER AND ANALOG-TO-DIGITAL CONVERSION METHOD USING THE SAME

(71) Applicant: SK hynix Inc., Gyeonggi-do (KR)

(72) Inventors: Ja-Seung Gou, Gyeonggi-do (KR);
Oh-Kyong Kwon, Seoul (KR);
Min-Seok Shin, Seoul (KR); Min-Kyu Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/718,653

(22) Filed: Dec. 18, 2012

(65) Prior Publication Data

US 2014/0062752 A1    Mar. 6, 2014

(30) Foreign Application Priority Data

Aug. 30, 2012   (KR) .................. 10-2012-0095630

(51) Int. Cl.
*H03M 1/12* (2006.01)

(52) U.S. Cl.
USPC .......................................... 341/155; 341/172

(58) Field of Classification Search
USPC .......................................... 341/156, 144, 122
See application file for complete search history.

(56) References Cited

U.S. PATENT DOCUMENTS

| 4,803,462 A * | 2/1989 | Hester et al. ................. 341/172 |
| 6,587,066 B1 * | 7/2003 | Somayajula ................. 341/172 |
| 7,786,908 B2 * | 8/2010 | Yoshinaga ................... 341/118 |
| 7,834,796 B2 * | 11/2010 | Xu et al. ...................... 341/172 |
| 2012/0146829 A1 * | 6/2012 | Baghini et al. .............. 341/161 |

FOREIGN PATENT DOCUMENTS

| KR | 1020050117321 | 12/2005 |
| KR | 1020100048477 | 5/2010 |

OTHER PUBLICATIONS

Shinichiro Matsuo, et al., "8.9-Megapixel Video Image Sensor With 14-b Column-Parallel SA-ADC," IEEE Transactions on electron devices. vol. 56, No. 11, pp. 2380-2389, Nov. 2009.

M.S., Shin, et al., "14-bit two-step successive approximation ADC with calibration circuit for high-resolution CMOS imagers," Electronics Letters vol. 47, No. 14, Jul. 7, 2011.

* cited by examiner

*Primary Examiner* — Peguy Jean Pierre

(74) *Attorney, Agent, or Firm* — IP & T Group LLP

(57) ABSTRACT

An analog-to-digital converter includes a comparison unit that outputs a result obtained by comparing a voltage of an input node with a comparison voltage; $1^{st}$ to $N^{th}$ capacitors having one ends connected to the input node, respectively; and $1^{st}$ to $N-1^{th}$ voltage selection units corresponds to the $2^{nd}$ to $N^{th}$ capacitors, respectively and applies one of a voltages of a $1^{st}$ node, a $2^{nd}$ node, and the comparison voltage to the other ends of the corresponding capacitors. An input signal is sampled to the input node, the $1^{st}$ to $N-1^{th}$ voltage selection units select one of the voltages of the 2 nodes and convert a part of the input signal into a $1^{st}$ digital signal, and the $1^{st}$ to $N-1^{th}$ voltage selection units select one of the voltages of the 2 nodes and convert the remaining part of the input signal into a $2^{nd}$ digital signal.

25 Claims, 14 Drawing Sheets

ANALOG-TO-DIGITAL CONVERTER AND ANALOG-TO-DIGITAL CONVERSION METHOD USING THE SAME

CROSS-REFERENCE TO RELATED APPLICATIONS

The present application claims priority of Korean Patent Application No. 10-2012-0095630, filed on Aug. 30, 2012, which is incorporated herein by reference in its entirety.

BACKGROUND

1. Field

Exemplary embodiments of the present invention relate to an analog-to-digital converter (ADC) and an analog-to-digital (AD) conversion method using the same.

2. Description of the Related Art

Most systems currently used are designed based on a digital signal processing technique. In this regard, the role of an analog-to-digital converter, which is an initial step of digital signal processing, is important.

FIG. 1 is a configuration diagram illustrating a part of a conventional ADC.

As illustrated in FIG. 1, the ADC includes a comparator 110 and $1^{st}$ to $N^{th}$ capacitors C1 to CN (FIG. 1 shows 6 capacitors).

The comparator 110 outputs a comparison result between a comparison voltage VCMP and an input voltage IN, which corresponds to each bit of a digital signal AD converted from an input signal sampled to the input node IN.

One end of each of the $1^{st}$ to $N^{th}$ capacitors C1 to CN is connected to the input node IN, and the other ends of the capacitors C1 to CN receive one of an input signal, the comparison voltage VCMP, and one or more reference voltages. Since the capacitances of the capacitors C1 to CN have a weighted value, a capacitance of a $K^{th}$ ($2 \leq K \leq N$) capacitor of the capacitors C1 to CN is generally $2^{(N-K-1)}$ times as large as a capacitance of the $N^{th}$ capacitor.

In a sampling step, the input signal is applied to the other ends of the capacitors C1 to CN, so that the capacitors C1 to CN are charged and the input signal is sampled.

In a conversion step, one of the one or more reference voltages is applied to the other ends of the capacitors C1 to CN according to the comparison result of the comparator 110. When the conversion step is completed, a reference voltage applied to the other ends of the capacitors C1 to CN determines a value of each bit of the digital signal AD converted from the input signal.

In general, conversion from an input signal into a N-bit digital signal needs N capacitors, and N-1 voltage selection units, which select a voltage to be applied to N-1 capacitors (the comparison voltage VCMP is applied to the other end of the $N^{th}$ capacitor CN), and a control unit 120 that generates a control signal for controlling the N-1 voltage selection units.

As the value of N is increased, resolution is increased and thus a digital signal has a digital value more approximate to a value of an actual input signal. However, according to the conventional ADC, as increase of resolution needs more capacitor and the control unit 120, the conventional ADC is required to have a significant increase in a circuit area. For example, when the resolution is increased twice, the number of the capacitors should be increased twice, capacities of added capacitors also should be increased twice, and thus areas for the capacitors should be increased more than twice as the original resolution. Furthermore, as the number of signals for controlling a switching unit (S1 to S5) for selecting a voltage to be applied to the other end of the capacitor should be increased twice as before the original resolution, the area for the control unit 120 also should be increased more than twice.

Therefore, doubled increase of the resolution requires more than doubled area of the ADC, which leads to serious increase of power consumption and limits improvement of the resolution.

SUMMARY

Exemplary embodiments of the present invention are directed to an ADC that has N-bit resolution, resamples a part remaining after AD converting an input signal, and analog-to-digital converts the remaining part, thereby increasing resolution beyond N bits and reducing an area and power consumption, and an AD conversion method using the same.

In accordance with an embodiment of the present invention, an analog-to-digital converter (ADC) includes a comparison unit configured to output a result obtained by comparing a voltage of an input node with a comparison voltage; $1^{st}$ to $N^{th}$ capacitors having one ends connected to the input node, respectively; and $1^{st}$ to $N-1^{th}$ voltage selection units corresponding to the $2^{nd}$ to $N^{th}$ capacitors, respectively and configured to apply one of a voltages of a $1^{st}$ node, a $2^{nd}$ node, and the comparison voltage to the other ends of the corresponding capacitors, wherein an input signal is sampled to the input node in a $1^{st}$ sampling operation, the $1^{st}$ to $N-1^{th}$ voltage selection units select one of the voltages of the $1^{st}$ node and the $2^{nd}$ node according to output of the comparison unit, and convert a part of the input signal into a $1^{st}$ digital signal in a $1^{st}$ conversion operation, the input signal is applied to the input node in a state were the $1^{st}$ to $N-1^{st}$ voltage selection units select a voltage of the other node which is not selected between the voltages of the $1^{st}$ node and the $2^{nd}$ node in the $1^{st}$ conversion operation, a remaining part of the input signal, which is not converted into the $1^{st}$ digital signal in the $1^{st}$ conversion operation, is sampled to the input node in a $2^{nd}$ sampling operation, and the $1^{st}$ to $N-1^{th}$ voltage selection units select one of the voltages of the $1^{st}$ node and the $2^{nd}$ node according to the output of the comparison unit, and convert the remaining part of the input signal into a $2^{nd}$ digital signal in a $2^{nd}$ conversion operation.

In accordance with another embodiment of the present invention, an analog-to-digital converter (ADC) includes a comparison unit configured to output a result obtained by comparing a voltage of an input node with a comparison voltage; $1^{st}$ to $N^{th}$ capacitors having one ends connected to the input node, respectively; $1^{st}$ to $N-1^{th}$ voltage selection units corresponding to $2^{nd}$ to $N^{th}$ capacitors, respectively and configured to apply one of a voltages of a $1^{st}$ node, a $2^{nd}$ node, and the comparison voltage to the other ends of the corresponding capacitors; a control unit configured to control the $1^{st}$ to $N-1^{th}$ voltage selection units to sample an input signal to the input node in a $1^{st}$ sampling operation, the $1^{st}$ to $N-1^{th}$ voltage selection units to select one of a voltages of the $1^{st}$ node and the $2^{nd}$ node according to output of the comparison unit and to generate a $1^{st}$ digital signal in a $1^{st}$ conversion operation, the input signal to be applied to the input node in a state where the $1^{st}$ to $N-1^{th}$ voltage selection units select a voltage of the other node which is not selected between the voltages of the $1^{st}$ node and the $2^{nd}$ node in the $1^{st}$ conversion operation, the $1^{st}$ to $N-1^{th}$ voltage selection units to sample a remaining part of the input signal, which is not converted into the $1^{st}$ digital signal in the $1^{st}$ conversion operation, to the input node in a $2^{nd}$ sampling operation, and to select one of the voltages of the $1^{st}$ node and the $2^{nd}$ node according to the output of the comparison unit, and to generate a $2^{nd}$ digital signal in a $2^{nd}$ conversion operation; and a correction unit configured to generate a corrected digital signal of the AD converted input signal using the $1^{st}$ digital signal and the $2^{nd}$ digital signal.

In accordance with another embodiment of the present invention, an analog-to-digital conversion method includes a $1^{st}$ sampling step for applying a comparison voltage to the other ends of the $1^{st}$ to $N^{th}$ capacitors, applying an input signal to the input node, and sampling the input signal to an input node; a $1^{st}$ converting step for selecting one of a $1^{st}$ reference voltage and a $2^{nd}$ reference voltage according to the output of the comparison unit, sequentially applying a selected voltage to the other ends of the $2^{nd}$ to $N^{th}$ capacitors, and converting a part of the input signal into a $1^{st}$ digital signal; a $2^{nd}$ sampling step for applying the input signal to the input node to charge the $1^{st}$ to $N^{th}$ capacitors in a state in which a voltage of the $1^{st}$ reference voltage and the $2^{nd}$ reference voltage, which is not applied in the $1^{st}$ converting step, is applied to the other ends of the $2^{nd}$ to $N^{th}$ capacitors, and for applying the comparison voltage to the other ends of the $2^{nd}$ to $N^{th}$ capacitors without applying the input signal to the input node, thereby sampling a remaining part of the input signal, which has not been converted into the $1^{st}$ digital signal; and a $2^{nd}$ converting step for selecting one of a $3^{rd}$ reference voltage and a $4^{th}$ reference voltage according to the output of the comparison unit, and for sequentially applying a selected voltage to the other ends of the $2^{nd}$ to $N^{th}$ capacitors, thereby converting the remaining part of the input signal into a $2^{nd}$ digital signal.

In accordance with another embodiment of the present invention, an analog-to-digital converter (ADC) includes a comparison unit configured to output a result obtained by comparing a voltage of an input node with a comparison voltage; $1^{st}$ to $N^{th}$ capacitors having one ends connected to the input node, respectively; and $1^{st}$ to $N-1^{th}$ voltage selection units corresponding to the $2^{nd}$ to $N^{th}$ capacitors, respectively and configured to apply one of a $1^{st}$ reference voltage, a $2^{nd}$ reference voltage, and the comparison voltage to the other ends of the corresponding capacitors, or to apply one of a $3^{rd}$ reference voltage, a $4^{th}$ reference voltage, and the comparison voltage to the other ends of corresponding capacitors, wherein an input signal is sampled to the input node in a $1^{st}$ sampling operation, the $1^{st}$ to $N-1^{th}$ voltage selection units select one of the $1^{st}$ reference voltage and the $2^{nd}$ reference voltage according to output of the comparison unit, and convert a part of the input signal into a $1^{st}$ digital signal in a $1^{st}$ conversion operation, the input signal is applied to the input node in a state where the $1^{st}$ to $N-1^{th}$ voltage selection units select a voltage of the other node which is not selected between the voltages of the $1^{st}$ node and the $2^{nd}$ node in the $1^{st}$ conversion operation, a remaining part of the input signal, which is not converted into the $1^{st}$ digital signal in the $1^{st}$ conversion operation, is sampled to the input node in a $2^{nd}$ sampling operation, and the $1^{st}$ to $N-1^{th}$ voltage selection units select one of the $3^{rd}$ reference voltage and the $4^{th}$ reference voltage according to the output of the comparison unit, and convert the remaining part of the input signal into a $2^{nd}$ digital signal in a $2^{nd}$ conversion operation.

In accordance with another embodiment of the present invention, an analog-to-digital converter (ADC) includes a comparison unit configured to output a result obtained by comparing a voltage of an input node with a comparison voltage; $1^{st}$ to $N^{th}$ capacitors having one ends connected to the input node, respectively; $1^{st}$ to $N-1^{th}$ voltage selection units corresponding to $2^{nd}$ to $N^{th}$ capacitors, respectively and configured to apply one of a $1^{st}$ reference voltage, a $2^{nd}$ reference voltage, and the comparison voltage to the other ends of the corresponding capacitors, or to apply one of a $3^{rd}$ reference voltage, a $4^{th}$ reference voltage, and the comparison voltage to the other ends of the corresponding capacitors; and a control unit configured to control the $1^{st}$ to $N-1^{th}$ voltage selection units to sample an input signal to the input node in a $1^{st}$ sampling operation, the $1^{st}$ to $N-1^{th}$ voltage selection units to select one of the $1^{st}$ reference voltage and the $2^{nd}$ reference voltage according to output of the comparison unit and to generate a $1^{st}$ digital signal in a $1^{st}$ conversion operation, the input signal to be applied to the input node in a state where the $1^{st}$ to $N-1^{th}$ voltage selection units select a voltage of the other node which is not selected between the $1^{st}$ reference voltage and the $2^{nd}$ reference voltage in the $1^{st}$ conversion operation, the $1^{st}$ to $N-1^{th}$ voltage selection units to sample a remaining part of the input signal, which is not converted into the $1^{st}$ digital signal in the $1^{st}$ conversion operation, to the input node in a $2^{nd}$ sampling operation, and to select one of the $3^{rd}$ reference voltage and the $4^{th}$ reference voltage according to the output of the comparison unit, and to generate a $2^{nd}$ digital signal in a $2^{nd}$ conversion operation; and a correction unit configured to generate a corrected digital signal of the AD converted input signal using the $1^{st}$ digital signal and the $2^{nd}$ digital signal.

According to the present invention, a part remaining after AD conversion of an input signal is resampled and is subject to AD conversion, so that it is possible to perform AD conversion for the input signal with resolution higher than N bits using a configuration of a basic ADC with N-bit resolution. That is, it is possible to reduce an area of an ADC with resolution higher than N bits.

Furthermore, according to the present invention, it is possible to operate only with the configuration of the basic ADC with N-bit resolution, and to reduce power consumption of the ADC with resolution higher than N bits because power is less consumed in a resampling operation.

DETAILED DESCRIPTION

Figure 1:
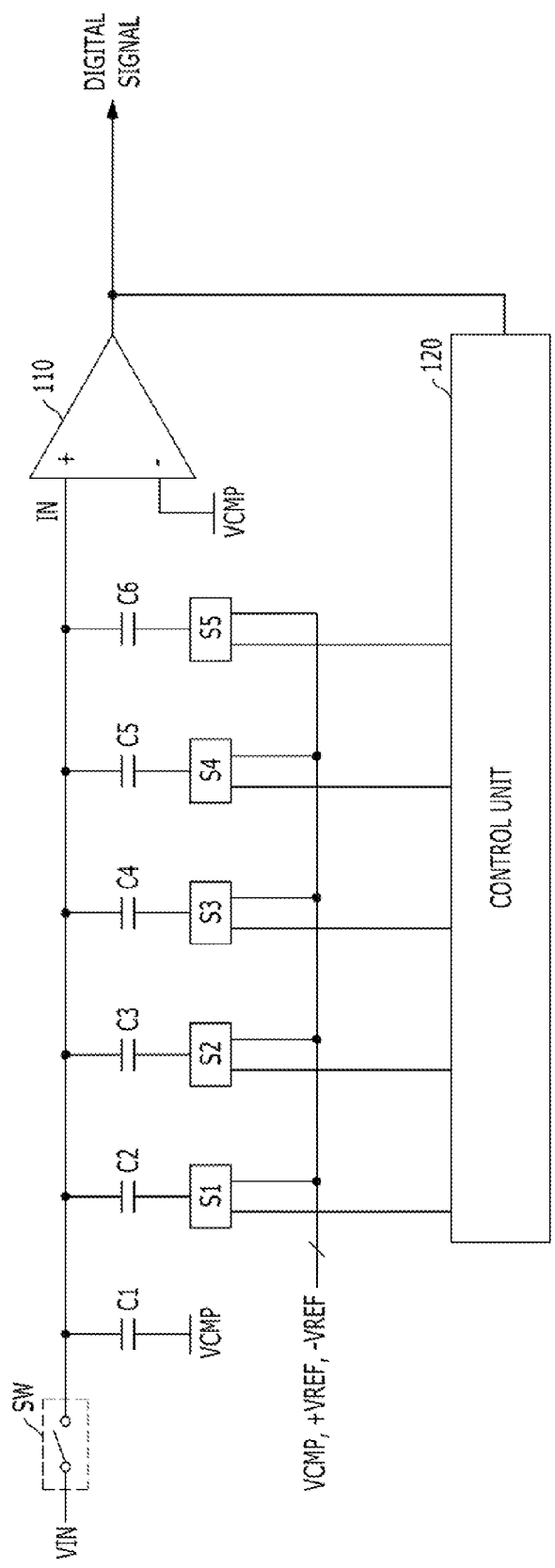
FIG. 1 is a configuration diagram illustrating a part of a conventional ADC.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. In this specification, comparison voltage VCMP is a reference voltage for comparison in a comparator for determining a voltage level of an input signal VIN. An ADC converts into a digital signal a difference between the input signal VIN and the comparison voltage VCMP. Ground GND may be the comparison voltage VCMP, which is set as an example and all the other voltages refer to ground GND as the comparison voltage VCMP in the description of the present invention in this specification.

Figure 2:
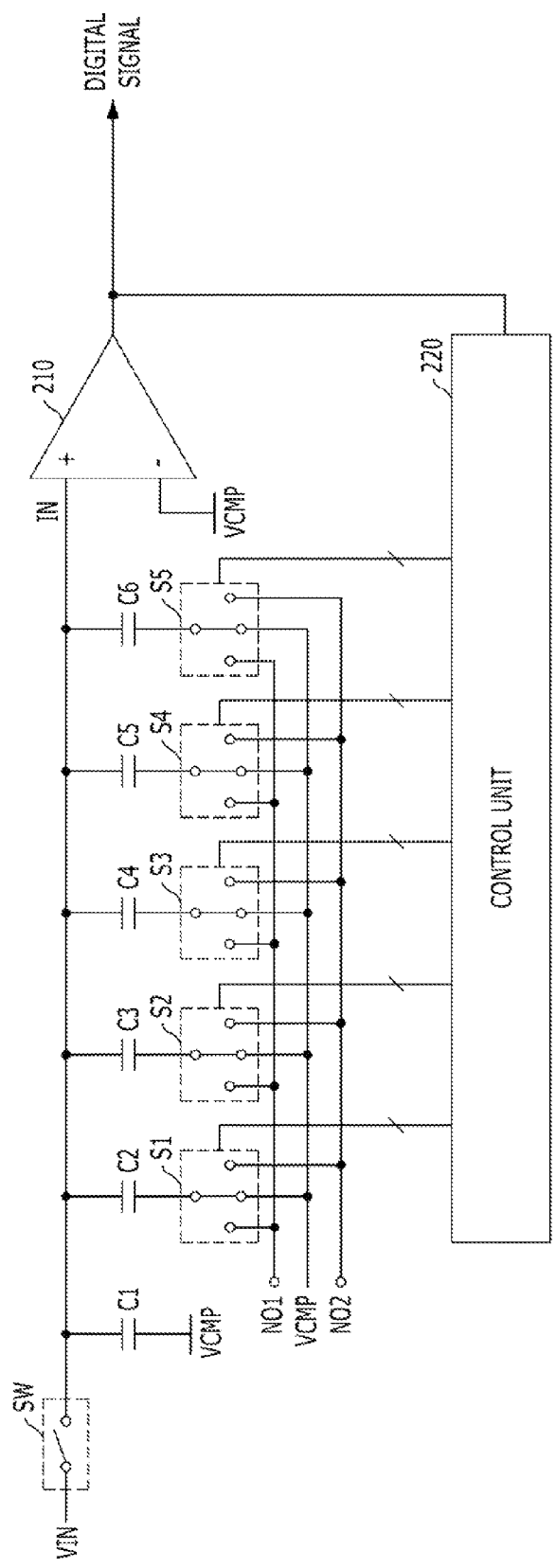
FIG. 2 is a configuration diagram of an ADC in accordance with an embodiment of the present invention.

FIG. 2 is a configuration diagram of an ADC in accordance with an embodiment of the present invention. FIGS. 3A to 3E are diagrams for explaining the operation of the ADC.

As illustrated in FIG. 2, the ADC includes $1^{st}$ to $N^{th}$ capacitors C1 to CN, a comparison unit 210, and a control unit 220 and $1^{st}$ to $N-1^{th}$ voltage selection units S1 to SN-1. FIG. 2 shows 6 capacitors C1 to C6 and five voltage selection units S1 to S5 (N=6) whose number may vary according to circuit design. The one end of respective $1^{st}$ to $N^{th}$ capacitors C1 to CN is connected to the input node IN. The comparison unit 210 outputs a comparison result of a voltage of an Input node IN and the comparison voltage VCMP. The $1^{st}$ to $N-1^{th}$ voltage selection units S1 to SN-1 correspond to $1^{st}$ $2^{nd}$ to $N^{th}$ capacitors C2 to CN, respectively and apply one of a voltage of a $1^{st}$ node NO1, a voltage of a $2^{nd}$ node NO2, and the comparison voltage VCMP to the other end of corresponding capacitor.

In a $1^{st}$ sampling operation, an input signal VIN is sampled to the input node IN. In a $1^{st}$ conversion operation, the $1^{st}$ to $N-1^{th}$ voltage selection units S1 to SN-1 select one of the voltages of the $1^{st}$ node NO1 and the $2^{nd}$ node NO2 according to the output of the comparison unit 210, and convert a part of the input signal VIN into $1^{st}$ digital signals D1<0:N-2>.

In a $2^{nd}$ sampling operation, in the state where the $1^{st}$ to $N-1^{th}$ voltage selection units S1 to SN-1 have selected a voltage of the other node, which was not selected between the voltages of the $1^{st}$ node NO1 and the $2^{nd}$ node NO2 in the $1^{st}$ conversion operation, the input signal VIN is applied to the input node IN.$1^{st}1^{st}2^{nd}$ In that state, the remaining part of the input signal VIN, which has not been converted into the $1^{st}$ digital signals D1<0:N-2> in the $1^{st}$ conversion operation, is sampled to the input node IN.

In a $2^{nd}$ conversion operation, the $1^{st}$ to $N-1^{th}$ voltage selection units S1 to SN-1 select one of the voltages of the $1^{st}$ node NO1 and the $2^{nd}$ node NO2 according to the output of the comparison unit 210, and convert the remaining part of the input signal VIN into $2^{nd}$ digital signals D2<0:N-1>.

The control unit 220 controls the $1^{st}$ to $N-1^{th}$ voltage selection units S1 to SN-1 in response to the output of the comparison unit 210 in the $1^{st}$ and the $2^{nd}$ conversion operation. When the voltage of the input node IN is higher than the comparison voltage VCMP, the control unit 220 controls a voltage selection units S1 to SN-1 to select the voltage of the $2^{nd}$ node NO2. However, when the voltage of the input node IN is lower than the comparison voltage VCMP, the control unit 220 controls the voltage selection units S1 to SN-1 to select the voltage of the $1^{st}$ node NO1.

The present invention includes a capacitor array and converts an analog signal into a digital signal using charge redistribution of the capacitor array. To this end, capacitances of the capacitors C1 to CN have the following relation. A capacitance of a $K^{th}$ ($2 \leq K \leq N$) capacitor of the $2^{nd}$ to $N^{th}$ capacitors is $2^{\wedge}(N-2)$ times as large as a capacitance of the $1^{st}$ capacitor. For example, a capacitance of the $3^{rd}$ capacitor C3 is twice ($2^{\wedge}(3-1)$) times as large as the capacitance of the $1^{st}$ capacitor.

An $X^{th}$ ($1 \leq X \leq N-1$) voltage selection unit SX corresponds to an $X+1^{th}$ capacitor CX+1. For example, the $4^{th}$ voltage selection unit S4 corresponds to a $5^{th}$ capacitor C5.

Figure 3A:
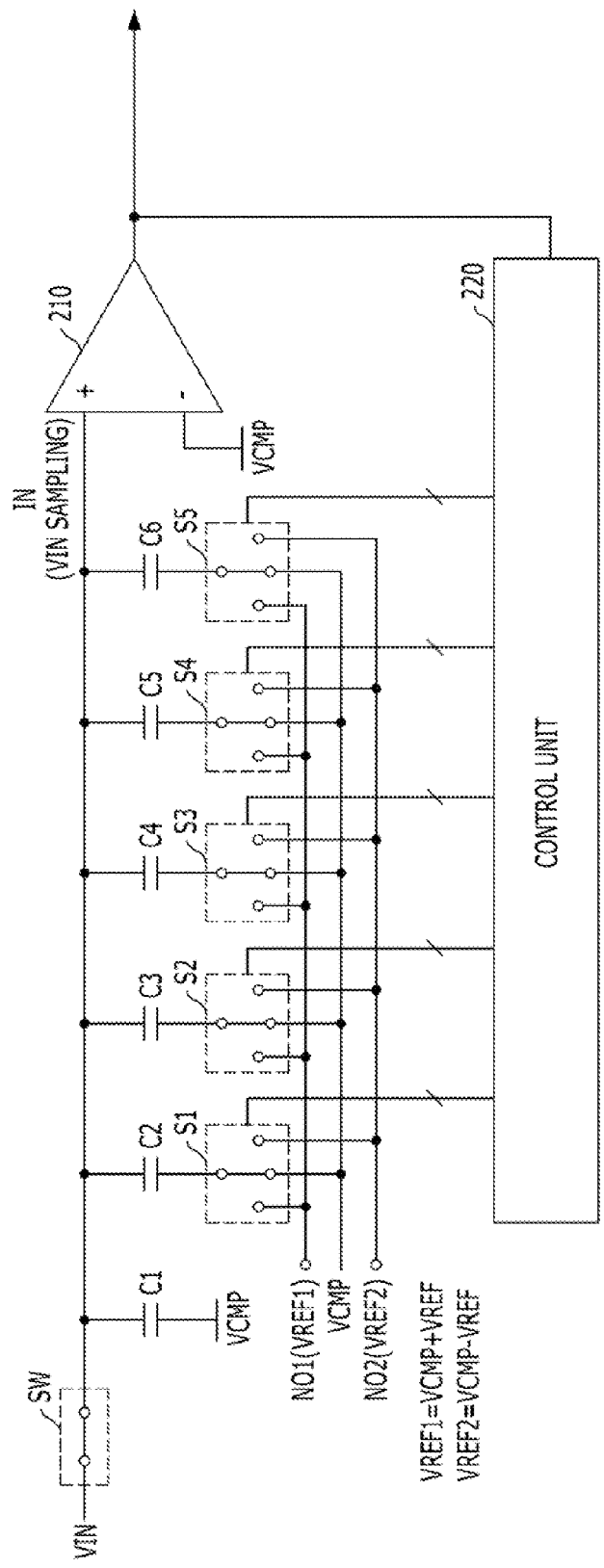
FIG. 3A to FIG. 3E are diagrams for explaining the operation of an ADC.

The ADC according to the present invention converts the input signal VIN into digital signals DIG<0:2N-2> of 2N-1 bits through two times of conversion operation. The operation of the conversion according to the present invention is as follows, $1^{st}$ Sampling and Conversion Operation of ADC FIG. 3A is a diagram for explaining the $1^{st}$ sampling operation of the ADC. In the $1^{st}$ sampling operation, the ADC samples the input signal VIN. The input signal VIN is an analog signal and has a characteristic in terms of voltage level.

As illustrated in FIG. 3A, in the $1^{st}$ sampling operation, the $1^{st}$ to $5^{th}$ voltage selection units S1 to S5 have selected the comparison voltage VCMP. In that state, a switch SW is turned on, so that the input signal VIN is applied to the input node IN, which means that the comparison voltage VCMP has been applied to the other ends of the $1^{st}$ to $6^{th}$ capacitors C1 to C6 when the input signal VIN is applied to the input node IN (one end of each of the $1^{st}$ to $6^{th}$ capacitors C1 to C6). The $1^{st}$ to $6^{th}$ capacitors C1 to C6 are charged by the input signal VIN. A voltage level of the input signal VIN may be higher or lower than that of the comparison voltage VCMP. When the charging of the $1^{st}$ to $6^{th}$ capacitors C1 to C6 is completed, the switch SW is turned off, which means that the input signal VIN is sampled to the input node IN (the input signal VIN is sampled because the comparison voltage VCMP is set as ground GND).

In the $1^{st}$ conversion operation, the control unit 220 applies a $1^{st}$ reference voltage VREF1 to the $1^{st}$ node NO1. The $1^{st}$ reference voltage VREF1 is higher than the comparison voltage VCMP by voltage level of VREF, which means that the voltage level of the $1^{st}$ reference voltage VREF1 is +VREF because VCMP is set as GND. The control unit 220 applies a $2^{nd}$ reference voltage VREF2 to the $2^{nd}$ node NO2. The $2^{nd}$ reference voltage VREF2 is lower than the comparison voltage VCMP by the voltage level of VREF, which means that the voltage level of the $2^{nd}$ reference voltage VREF2 is -VREF because VCMP is set as GND. Here, VREF indicates a reference voltage.

In the $1^{st}$ conversion operation, the $1^{st}$ to $5^{th}$ voltage selection units S1 to S5 select the comparison voltage VCMP, and the comparison unit 210 outputs a $1^{st}$ comparison result obtained by comparing the voltage of the input node IN with the comparison voltage VCMP. When the voltage of the input node IN is higher than the comparison voltage VCMP as the $1^{st}$ comparison result, the most significant bit D1<4> of $1^{st}$ digital signals D1<0:4> is determined to '1', and the $5^{th}$ voltage selection unit S5 selects the voltage of the $2^{nd}$ node NO2 (-VREF) under the control of the control unit 220. When the voltage of the input node IN is lower than the comparison voltage VCMP, the most significant bit D1<4> of the $1^{st}$ digital signals D1<0:4> is determined to '0', and the $5^{th}$ voltage selection unit S5 selects the voltage of the $1^{st}$ node NO1 (+VREF) under the control of the control unit 220.

During the process, charge stored in the $1^{st}$ to $6^{th}$ capacitors C1 to C6 is redistributed. According to conservation law of electrical charge, when the $5^{th}$ voltage selection unit S5 selects the $1^{st}$ reference voltage VREF1 (+VREF), the voltage of the input node IN becomes VIN+VREF/2 and when the $5^{th}$ voltage selection unit S5 selects the $2^{nd}$ reference voltage VREF2 (-VREF), the voltage of the input node IN becomes VIN-VREF/2.

Through the same process as the aforementioned $1^{st}$ comparison, the $2^{nd}$ to $5^{th}$ comparison results of the comparison unit 210 sequentially determine the values of D1<3>, D1<2>, D1<1>, and D1<0> of the $1^{st}$ digital signals D1<0:4>, and the $1^{st}$ to $4^{th}$ voltage selection units S1 to S4 select one of the $1^{st}$ reference voltage VREF1 (+VREF) and the $2^{nd}$ reference voltage VREF2 (−VREF). During each conversion step, the redistribution of charge stored in the $1^{st}$ to $6^{th}$ capacitors C1 to C6 occurs, and the voltage of the input node IN is changed by conservation law of electrical charge.

After the conversion operation is completed, among the bits of the $1^{st}$ digital signals D1<0:4>, a bit corresponding to a voltage selection unit selecting the $1^{st}$ reference voltage VREF1 (+VREF) has a value of '0', and a bit corresponding to a voltage selection unit selecting the $2^{nd}$ reference voltage VREF2 (−VREF) has a value of '1'.

Figure 3B:
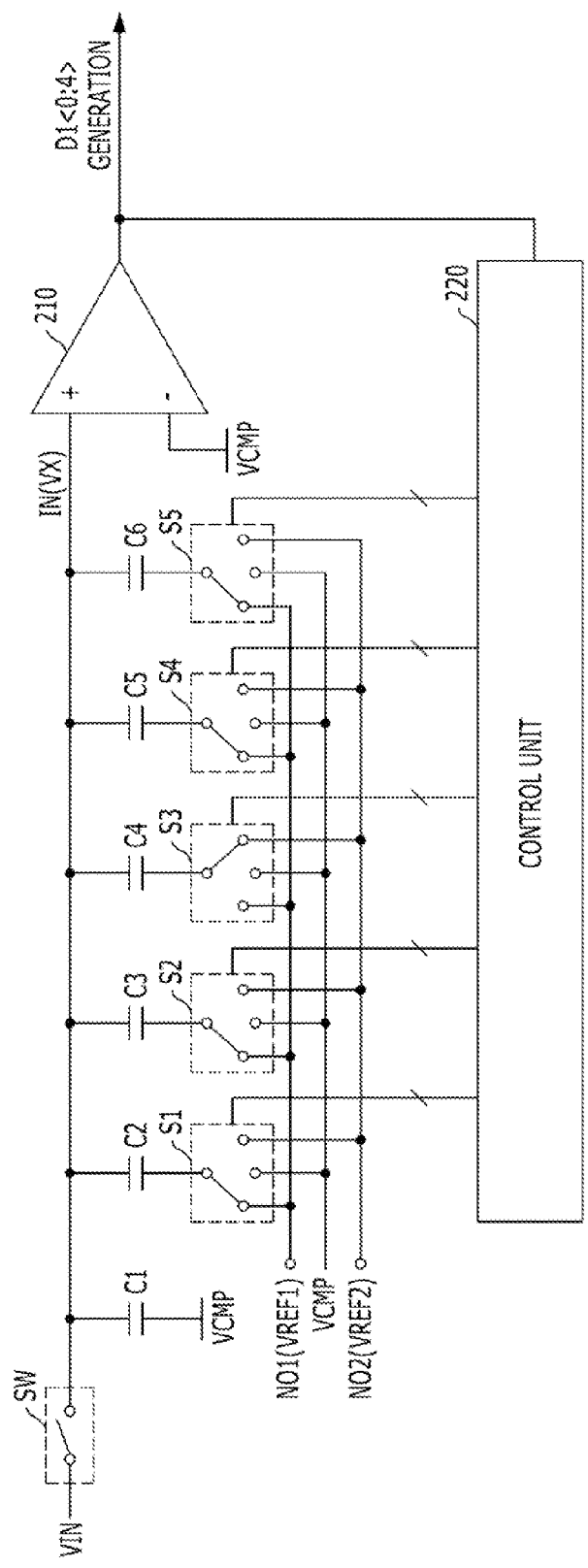

FIG. 3B is a diagram exemplifying the voltage selection of the $1^{st}$ to $5^{th}$ voltage selection units S1 to S5 after the $1^{st}$ conversion operation is completed in accordance with the embodiment. When the $5^{th}$ voltage selection unit S5, the $4^{th}$ voltage selection unit S4, the $2^{nd}$ voltage selection unit S2, and the $1^{st}$ voltage selection unit S1 select the $1^{st}$ reference voltage VREF1 (+VREF), and the $3^{rd}$ voltage selection unit S3 selects the $2^{nd}$ reference voltage VREF2 (−VREF), the values (D1<4>, D1<3>, D1<2>, D1<1>, and D1<0>) of the $1^{st}$ digital signals D1<0:4> are (0,0,1,0,0).

A voltage VX (hereinafter, referred to as a residue voltage VX) remaining in the input node IN after the completion of the $1^{st}$ conversion operation is VIN+VREF/2+VREF/4−VREF/8+VREF/16+VREF/32. The general residue voltage VX is VIN+A5×VREF/2+A4×VREF/4+A3×VREF/8+A2×VREF/16+A1×VREF/32, wherein A1 to A5 are factors for determining a sign, or one of +1 and −1. When a $Y^{th}$ voltage selection unit SY has selected the $1^{st}$ reference voltage VREF1 (+VREF), AY=+1 and when the $Y^{th}$ voltage selection unit SY has selected the $2^{nd}$ reference voltage VREF2 (−VREF), AY=−1.

According to the present invention, the residue voltage VX is sampled, and AD conversion is performed in the $2^{nd}$ conversion operation. A method for sampling the residue voltage VX will be described later.

$2^{nd}$ Sampling and Conversion Operation of ADC

Figure 3C:
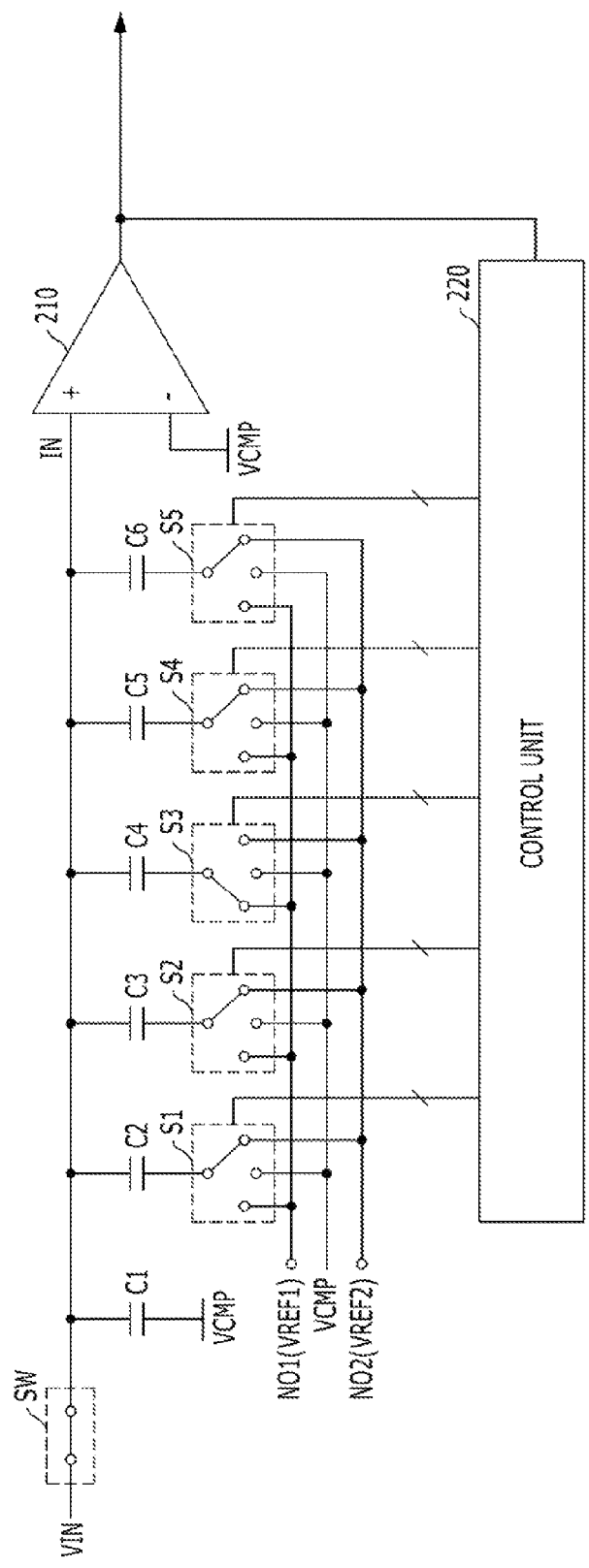
Figure 3D:
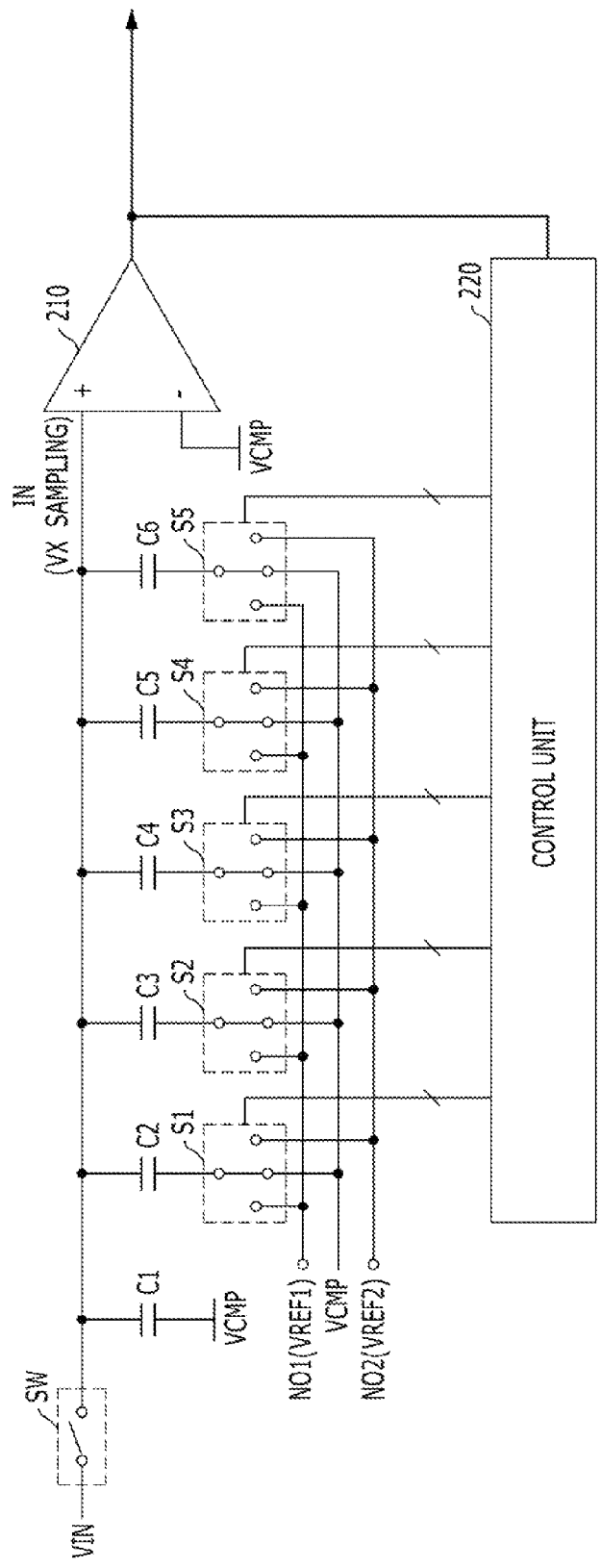

FIG. 3C and FIG. 3D are diagrams for explaining the $2^{nd}$ sampling operation of the ADC. In order to sample the residue voltage VX to the input node IN, the ADC operates as follows.

As illustrated in FIG. 3C, the switch SW is turned on, so that the input signal VIN is applied to the input node IN. Then, the $1^{st}$ to $5^{th}$ voltage selection units S1 to S5 respectively select a voltage of the other node which the $1^{st}$ to $5^{th}$ voltage selection units S1 to S5 is not selected in the $1^{st}$ conversion operation between the voltage of the $1^{st}$ node NO1 and the $2^{nd}$ node NO2. For example as illustrated in FIG. 3C, the $3^{rd}$ voltage selection unit S3 selects the $1^{st}$ reference voltage VREF1 (+VREF) in the $2^{nd}$ sampling operation since the $3^{rd}$ voltage selection unit S3 selects the $2^{nd}$ reference voltage VREF2 (−VREF) in the $1^{st}$ conversion operation. FIG. 3C illustrates a state in which the $1^{st}$ to $5^{th}$ voltage selection units S1 to S5 select a voltage of the other node which is not selected in FIG. 3B between the $1^{st}$ reference voltage VREF1 (+VREF) and the $2^{nd}$ reference voltage VREF2 (−VREF), in order to sample the residue voltage VX. The $5^{th}$ voltage selection unit S5, the $4^{th}$ voltage selection unit S4, the $2^{nd}$ voltage selection unit S2, and the $1^{st}$ voltage selection unit S1 select the $2^{nd}$ reference voltage VREF2 (−VREF), and the $3^{rd}$ voltage selection unit S3 selects the $1^{st}$ reference voltage VREF1 (+VREF).

At this time, when the capacitance of the $1^{st}$ capacitor C1 is normalized to '1' (for the convenience of calculation), the amount of charge accumulated in the input node IN is $CHR_{C1}+CHR_{C2}+CHR_{C3}+CHR_{C4}+CHR_{C5}+CHR_{C6}=$ (VIN)+(VIN+VREF)+2×(VIN+VREF)+4×(VIN−VREF)+ 8×(VIN+VREF)+16×(VIN+VREF), where $CHR_{CN}$ indicates the amount of charge accumulated in each of the $1^{st}$ to $6^{th}$ capacitors C1 to C.

When all the $1^{st}$ to $6^{th}$ capacitors C1 to C6 are charged, the switch SW is turned off and the $1^{st}$ to $5^{th}$ voltage selection units S1 to S5 select the comparison voltage VCMP, as illustrated in FIG. 3D, which leads to the redistribution of charge accumulated in the $1^{st}$ to $6^{th}$ capacitors C1 to C6 and thus to the determination of the voltage of the input node IN. The voltage of the input node IN will be referred to as a resampling voltage VR and is calculated using conservation law of electrical charge as follows.

(VIN)+(VIN+VREF)+2×(VIN+VREF)+4×(VIN−VREF)+8×(VIN+VREF)+16×(VIN+VREF)=32×VR

Since the left term of the equality indicates the amount of the charge accumulated in the $1^{st}$ to $6^{th}$ capacitors C1 to C6 in the state of FIG. 3C and the right term of the equality indicates the amount of the charge accumulated in the $1^{st}$ to $6^{th}$ capacitors C1 to C6 in the state of FIG. 3D, the left term and the right term have substantially the same value by conservation law of electrical charge. When the equality is expanded for the resampling voltage VR, the resampling voltage VR is VIN+VREF/2+VREF/4−VREF/8+VREF/16+VREF/32 and is substantially equal to the residue voltage VX. That is, through the process of FIG. 3C and FIG. 3D, the residue voltage VX may be resampled to the input node IN again without any further element.

Since the residue voltage VX is VIN+A5×VREF/2+A4×VREF/4+A3×VREF/8+A2×VREF/16+A1×VREF/32, the amount of the charge accumulated in the $1^{st}$ to $6^{th}$ capacitors C1 to C6 in the state of FIG. 3C is (VIN)+(VIN+A1×VREF)+ 2×(VIN+A2×VREF)+4×(VIN+A3×VREF)+8×(VIN+A4×VREF)+16×(VIN+A5×VREF).

Since this amount of the charge needs to be substantially equal to 32×VX, VX is finally VIN+A5×VREF/2+A4×VREF/4+A3×VREF/8+A2×VREF/16+A1×VREF/32. This is generally satisfied when the operations described with FIG. 3C and FIG. 3D are performed.

In general, in the case of the ADC of six capacitors, AD conversion with 6-bit resolution is possible. The reason for converting only 5 bits in the $1^{st}$ conversion operation is because sampling of the residue voltage VX is possible when the voltage selection units select a voltage opposite to a voltage previously selected in the $2^{nd}$ sampling operation. The other end of the $1^{st}$ capacitor C1 maintains the comparison voltage VCMP.

In the ideal case in which there is no offset voltage of the comparison unit 210, the residue voltage VX or the resampling voltage VR has a range between −VREF/($2^{(N-1)}$) and VREF/($2^{(N-1)}$). Accordingly, in the $2^{nd}$ conversion operation, the control unit 220 applies to the $1^{st}$ node NO1 a $3^{rd}$ reference voltage VREF3 (+VREF/($2^{(N-1)}$)) which is higher than the comparison voltage VCMP by the voltage VREF/($2^{(N-1)}$). The control unit 220 also applies to the $2^{nd}$ node NO2 a $4^{th}$ reference voltage VREF4 (−VREF/($2^{(N-1)}$)) which is lower than the comparison voltage VCMP by the voltage VREF/($2^{(N-1)}$).

In the $2^{nd}$ conversion operation, the comparison unit 210 outputs a $1^{st}$ comparison result obtained by comparing the voltage of the input node IN with the comparison voltage VCMP in the state in which the $1^{st}$ to fifth voltage selection units S1 to S5 have selected the comparison voltage VCMP. As the $1^{st}$ comparison result, when the voltage of the input node IN is higher than the comparison voltage VCMP, the most significant bit D2<5> of $2^{nd}$ digital signals D2<0:5> is determined to '1', and the $5^{th}$ voltage selection unit S5 selects the voltage of the $2^{nd}$ node NO2 (the $4^{th}$ reference voltage VREF4 ($-VREF/(2^{(N-1)})$)) under the control of the control unit 220. Meanwhile, when the voltage of the input node IN is lower than the comparison voltage VCMP, the most significant bit D2<5> of the $2^{nd}$ digital signals D2<0:5> is determined to '0', and the $5^{th}$ selection unit S5 selects the voltage of the $1^{st}$ node NO1 (the $3^{rd}$ reference voltage VREF3 ($+VREF/(2^{(N-1)})$)) under the control of the control unit 220.

During the process, the charge stored in the $1^{st}$ to $6^{th}$ capacitors C1 to C6 is redistributed. By conservation law of electrical charge, when the $5^{th}$ voltage selection unit S5 selects the $3^{rd}$ reference voltage VREF3 ($+VREF/(2^{(N-1)})$), the voltage of the input node IN becomes $VX+VREF/(2^N)$ and when the $5^{th}$ voltage selection unit S5 selects the $4^{th}$ reference voltage VREF4 ($-VREF/(2^{(N-1)})$), the voltage of the input node IN becomes $VX-VREF/(2^N)$.

Through the same process as the aforementioned $2^{nd}$ comparison, as $2^{nd}$ to fifth comparison results of the comparison unit 210 sequentially determine the values of D2<4>, D2<3>, D2<2>, D2<1>, and D2<0> of the $2^{nd}$ digital signals D2<0: 5>, and the $1^{st}$ to $4^{th}$ voltage selection units S1 to S4 select one of the $3^{rd}$ reference voltage VREF3 ($+VREF/(2^{(N-1)})$) and the $4^{th}$ reference voltage VREF4 ($-VREF/(2^{(N-1)})$).

After the $1^{st}$ voltage selection unit S1 selects one of the $3^{rd}$ reference voltage VREF3 ($+VREF/(2^{(N-1)})$) and the $4^{th}$ reference voltage VREF4 ($-VREF/(2^{(N-1)})$), the value of D2<0> is determined according to a result obtained by finally comparing the voltage of the input node IN with the comparison voltage VCMP one more time.

As described above, during each conversion step, the redistribution of charge stored in the $1^{st}$ to $6^{th}$ capacitors C1 to C6 occurs, and the voltage of the input node IN is changed by conservation law of electrical charge.

After the conversion operation is completed, among the bits of the $2^{nd}$ digital signals D2<0:5>, a bit corresponding to a voltage selection unit selecting the $3^{rd}$ reference voltage VREF3 ($+VREF/(2^{(N-1)})$) has a value of '0', and a bit corresponding to a voltage selection unit selecting the $4^{th}$ reference voltage VREF4 ($-VREF/(2^{(N-1)})$) has a value of '1'.

Figure 3E:
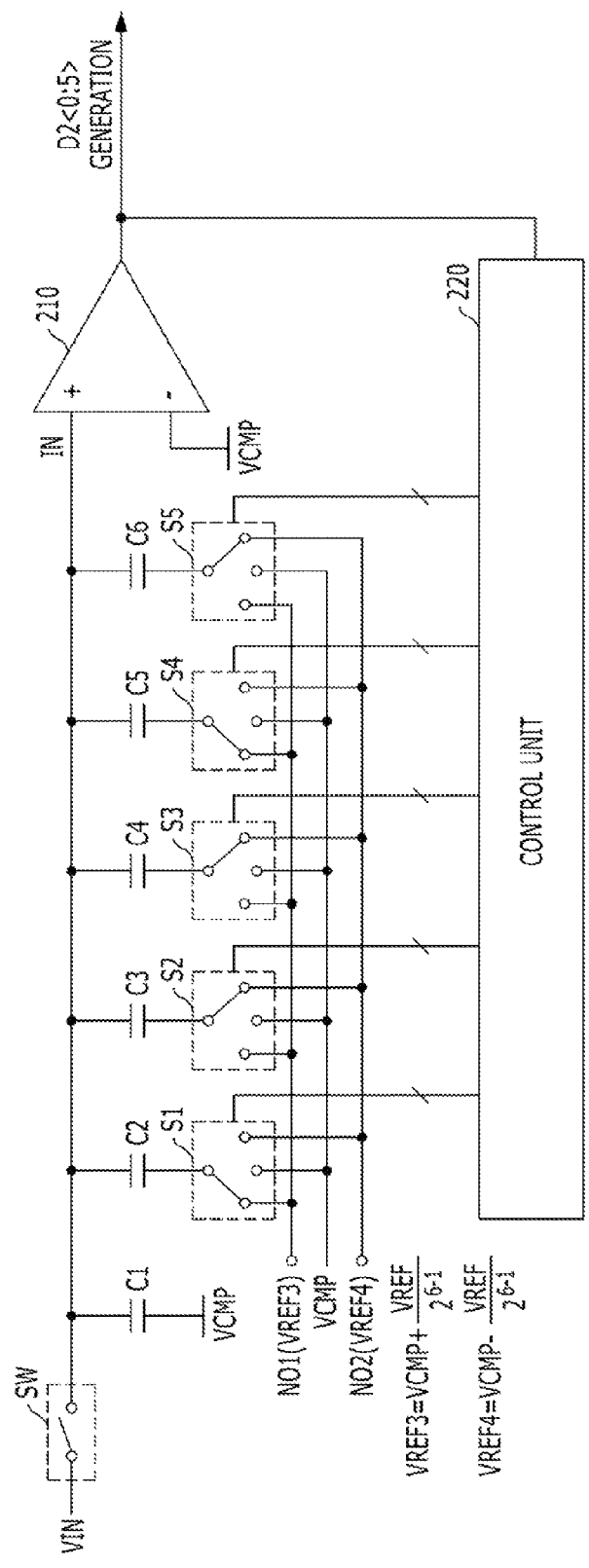

FIG. 3E is a diagram exemplifying the voltage selection of the $1^{st}$ to $5^{th}$ voltage selection units S1 to S5 after the $2^{nd}$ conversion operation is completed in accordance with an embodiment. When it is assumed that the $4^{th}$ voltage selection unit S4 and the $1^{st}$ voltage selection unit S1 select the $3^{rd}$ reference voltage VREF3 ($+VREF/(2^{(N-1)})$), the $5^{th}$ voltage selection unit S5, the $3^{rd}$ voltage selection unit S3, and the $2^{nd}$ voltage selection unit S2 select the $4^{th}$ reference voltage VREF4 ($-VREF/(2^{(N-1)})$), and the $6^{th}$ comparison result is '1', the values (D2<5>, D2<4>, D2<3>, D2<2>, D2<1>, and D2<0>) of the $2^{nd}$ digital signals D2<0:5> are (1,0,1,1,0,1).

As described above, the input signal VIN is converted into the digital signals using the $1^{st}$ reference voltage VREF1 (+VREF) and the $2^{nd}$ reference voltage VREF2 (−VREF) in the $1^{st}$ conversion operation, and the resampling voltage VR obtained by sampling the residue voltage VX remaining after the input signal VIN is converted in the $1^{st}$ conversion operation, is converted into the digital signals using the $3^{rd}$ reference voltage VREF3 ($+VREF/(2^{(N-1)})$) and the $4^{th}$ reference voltage VREF4 ($-VREF/(2^{(N-1)})$).

As a consequence, in the ADC, since the input signal VIN is converted into digital signals D<0:2N−2> of 2N−1 bits, $1^{st}$ digital signals D1<0:N−2> correspond to upper N−1 bits of the digital signals D<0:2N−1> and $2^{nd}$ digital signals D2<0: N−1> correspond to lower N bits of the digital signals D<0: 2N−1>.

In the aforementioned example, the $1^{st}$ digital signals D1<0:4> of 5 bits and the $2^{nd}$ digital signals D2<0:5> of 6 bits are generated using the ADC with 6-bit resolution, and digital signals D<0:10> of 11 bits are generated by AD converting the input signal VIN through a combination thereof. The upper 5 bits of digital signals D<0:10> correspond to the $1^{st}$ digital signals D1<0:4> and the lower 6 bits of digital signals D<0:10> correspond to the $2^{nd}$ digital signals D2<0:5>. The bits have the following correspondence relation.

(D1<4>, D1<3>, D1<2>, D1<1>, D1<0>, D2<5>, D2<4>, D2<3>, D2<2>D2<1>, and D2<0>)=(D<10>, D<9>, D<8>, D<7>, D<6>, D<5>, D<4>, D<3>, D<2>, D<1>, and D<0>)

Consequently, the values of the digital signals D<0:10> generated by AD converting the input signal VIN with 11-bit resolution, that is, (D<10>, D<9>, D<8>, D<7>D<6>, D<5>, D<4>, D<3>, D<2>, D<1>, and D<0>) are (0,0,1,0,0,1,0,1, 1,0,1).

According to the present invention, the ADC with low-bit resolution is used several times, so that it is possible to AD convert with resolution higher than the physical resolution of the ADC. Furthermore, since the operations of the aforementioned voltage selection units are used for the resampling of the residue voltage, no further configuration for the resampling of the residue voltage is not required.

In the aforementioned example, the conversion operation performed twice using the 6-bit ADC to convert the input signal into the 11-bit digital signals. However, the physical resolution of the ADC may vary according to design. Furthermore, the number of the AD conversion operations for higher resolution than physical resolution of ADC may vary. For example, when the conversion operation is performed four times using an ADC with 4-bit physical resolution, the input signal is converted with 3-bit resolution lower than the physical resolution by 1 bit and is resampled in the $1^{st}$ to $3^{rd}$ conversion operations, and the input signal is converted with 4-bit resolution (the physical resolution) in the $4^{th}$ conversion operations, so that it is possible to generate digital signals of 13 bits (3+3+3+4).

That is, in the case of performing the resampling with resolution lower than the physical resolution of the ADC by 1 bit, it is possible to perform the iterative conversion using the ADC. During the iteration, the magnitude of the reference voltage needs to be gradually reduced. For example, in the case of N-bit conversion using VREF and −VREF in $1^{st}$ conversion, it is necessary to use $VREF/(2^N)$ and $-REF/(2^N)$ in subsequent conversion.

Figure 4:
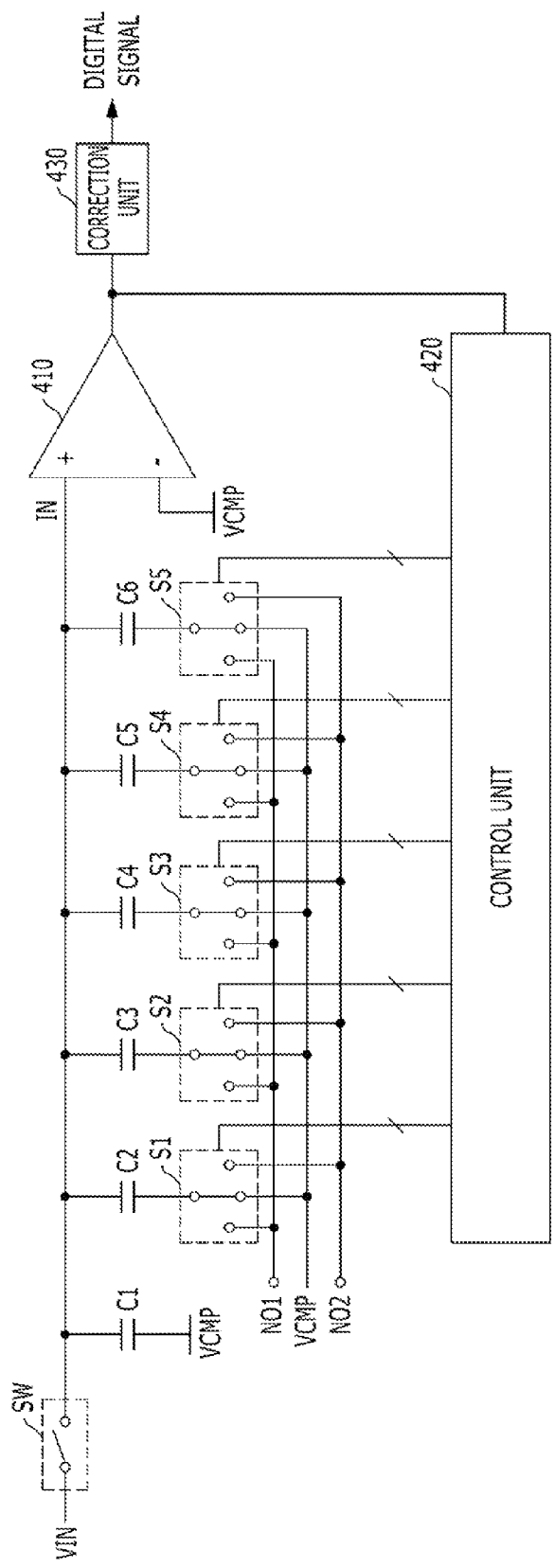
FIG. 4 is a configuration diagram illustrating an ADC in accordance with another embodiment of the present invention.

FIG. 4 is a configuration diagram of an ADC in accordance with another embodiment of the present invention. FIGS. 5A to 5E are diagrams for explaining the operation of the ADC.

The ADC of FIG. 4 is similar to the ADC of FIG. 2, but further includes a configuration and an operation for correcting the offset of a comparison unit 410.

As illustrated in FIG. 4, the ADC includes $1^{st}$ to $N^{th}$ capacitors C1 to CN, a comparison unit 410, $1^{st}$ to N−$1^{th}$ voltage selection units S1 to SN-1, a control unit 420, and a correction unit 430. FIG. 4 shows 6 capacitors C1 to C6 and 5 voltage selection units S1 to S5 (N=6), whose number may vary according to circuit design. The one end of respective $1^{st}$ to $N^{th}$ capacitors C1 to CN is connected to the input node IN. The comparison unit 410 outputs a comparison of a voltage of an input node IN and a comparison voltage VCMP. The $1^{st}$ to N−$1^{th}$ voltage selection units S1 to SN-1 correspond to $2^{nd}$ to $N^{th}$ capacitors C2 to CN, respectively, and apply one of a voltage of a 1st node NO1, a voltage of a 2nd node NO2, and the comparison voltage VCMP to the other ends of corresponding capacitor.

In a 1st sampling operation, the control unit 420 controls the 1st to N-1th voltage selection units S1 to SN-1 to sample an input signal VIN to the input node IN. In a 1st conversion operation, the control unit 420 controls the 1st to N-1th voltage selection units S1 to SN-1 to select one of the voltages of the 1st node NO1 and the 2nd node NO2 according to the output of the comparison unit 410 and to generate 1st digital signals D1<0:N-2>.

In a 2nd sampling operation, in the state where the 1st to N-1th voltage selection units S1 to SN-1 select a voltage of the other node, which was not selected in the 1st conversion operation between the voltages of the 1st node NO1 and the 2nd node NO2, the control unit 420 controls the input signal VIN to be applied to the input node IN. In that state, the remaining part of the input signal VIN, which is not converted into the 1st digital signals D1<0:N-2> in the 1st conversion operation, is sampled to the input node IN.

In a 2nd conversion operation, the control unit 420 controls the 1st to N-1th voltage selection units S1 to SN-1 to select one of the voltages of the 1st node NO1 and the 2nd node NO2 according to the output of the comparison unit 410, and to generate 2nd digital signals D2<0:N-1>.

The correction unit 430 uses the 1st digital signals D1<0:N-2> and the 2nd digital signals D2<0:N-1>, and generates digital signals D<0:2N-3>.

When the voltage of the input node IN is higher than the comparison voltage VCMP, the control unit 420 controls a voltage selection units S1 to SN-1 to select the voltage of the 2nd node NO2. However, when the voltage of the input node IN is lower than the comparison voltage VCMP the control unit 420 controls the voltage selection units S1 to SN-1 to select the voltage of the 1st node NO1.

The operations of ADCs of FIGS. 2 and 4 are similar. However, the ADC of FIG. 4 differs from the ADC of FIG. 2 in that the ADC of FIG. 4 performs a correction operation for reducing an error due to the offset of the comparison unit 410. The following description will be provided while focusing on the difference.

The present invention includes a capacitor array and converts an analog signal into a digital signal using charge redistribution of the capacitor array. To this end, capacitances of the capacitors C1 to CN have the following relation. A capacitance of a K$^{th}$ (2≤K≤N) capacitor of the 2$^{nd}$ to N$^{th}$ capacitors is $2^{(N-2)}$ times as large as a capacitance of the 1$^{st}$ capacitor. For example, a capacitance of the third capacitor C3 is twice ($2^{(3-1)}$) times as large as the capacitance of the 1$^{st}$ capacitor.

An X$^{th}$ (1≤X≤N-1) voltage selection unit SX corresponds to an X+1$^{th}$ capacitor CX+1. For example, the 4$^{th}$ voltage selection unit S4 corresponds to a 5$^{th}$ capacitor C5.

The ADC according to the present invention converts the input signal VIN into digital signals DIG<0:2N-3> of 2N-2 bits through two times of conversion operation. The operation of the conversion according to the present invention is as follows.

1$^{st}$ Sampling and Conversion Operation of ADC

Figure 5A:
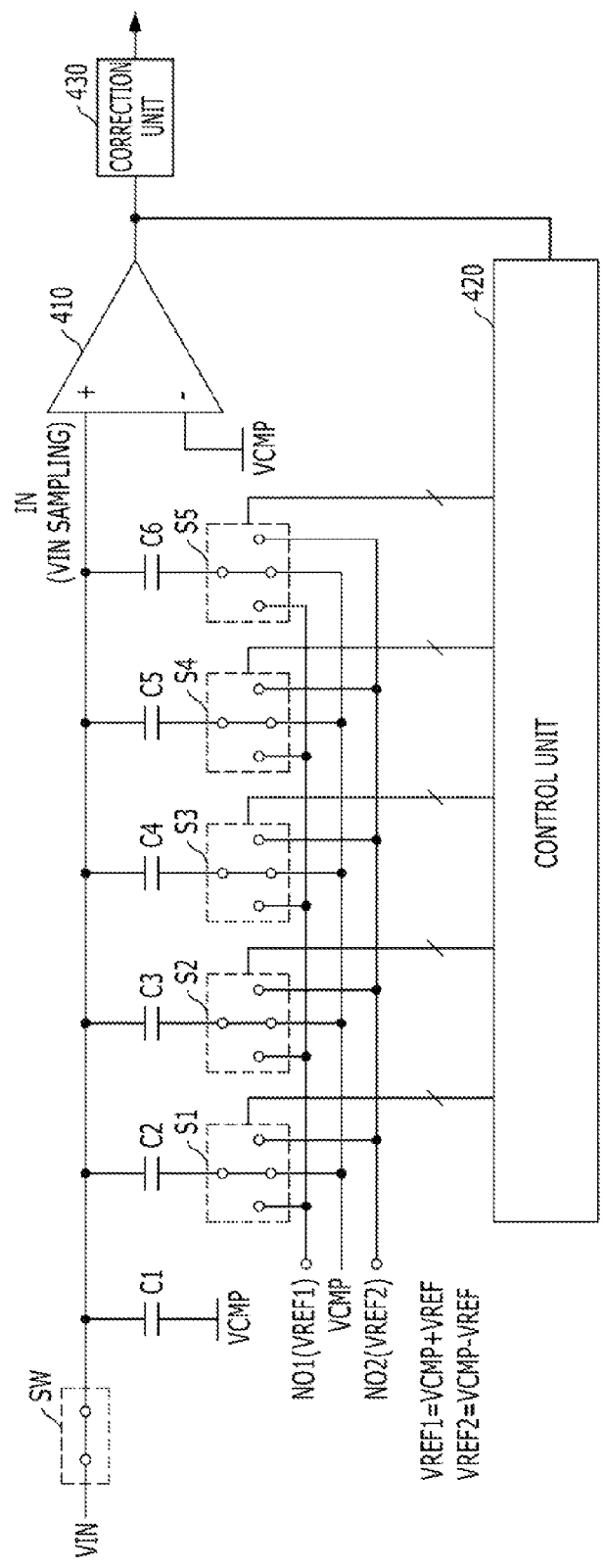
FIG. 5A to FIG. 5E are diagrams for explaining the operation of an ADC.
Figure 5B:
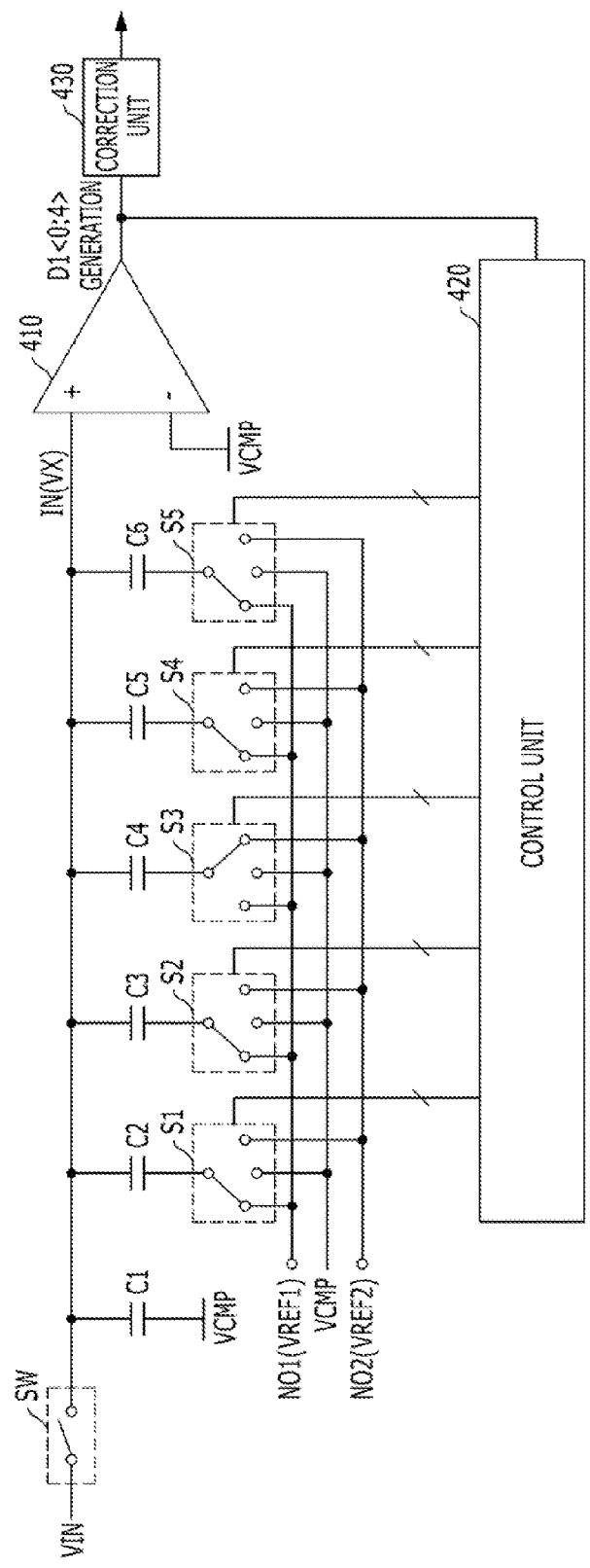

FIG. 5A is a diagram for explaining the 1$^{st}$ sampling operation of the ADC and FIG. 5B is a diagram for explaining the 1$^{st}$ conversion operation of the ADC. In the 1$^{st}$ conversion operation, since the operation of the ADC is substantially identical to that described in FIG. 2, FIG. 3A, and FIG. 3B, a detailed description thereof will be omitted.

It is assumed that the values of the 1$^{st}$ digital signals D1<0:4> generated in the 1$^{st}$ conversion operation are identical to the values described in FIG. 2, FIG. 3A, and FIG. 3B, that is, (D1<4>, D1<3>, D1<2>, D1<D1>, and D1<0>)=(0,0,1,0,0). The value of a residue voltage VX remaining in the input node IN after the 1$^{st}$ conversion operation of the ADC is substantially identical to that described in FIG. 2, FIG. 3A, and FIG. 3B.

2$^{nd}$ Sampling and Conversion Operation of ADC

Figure 5C:
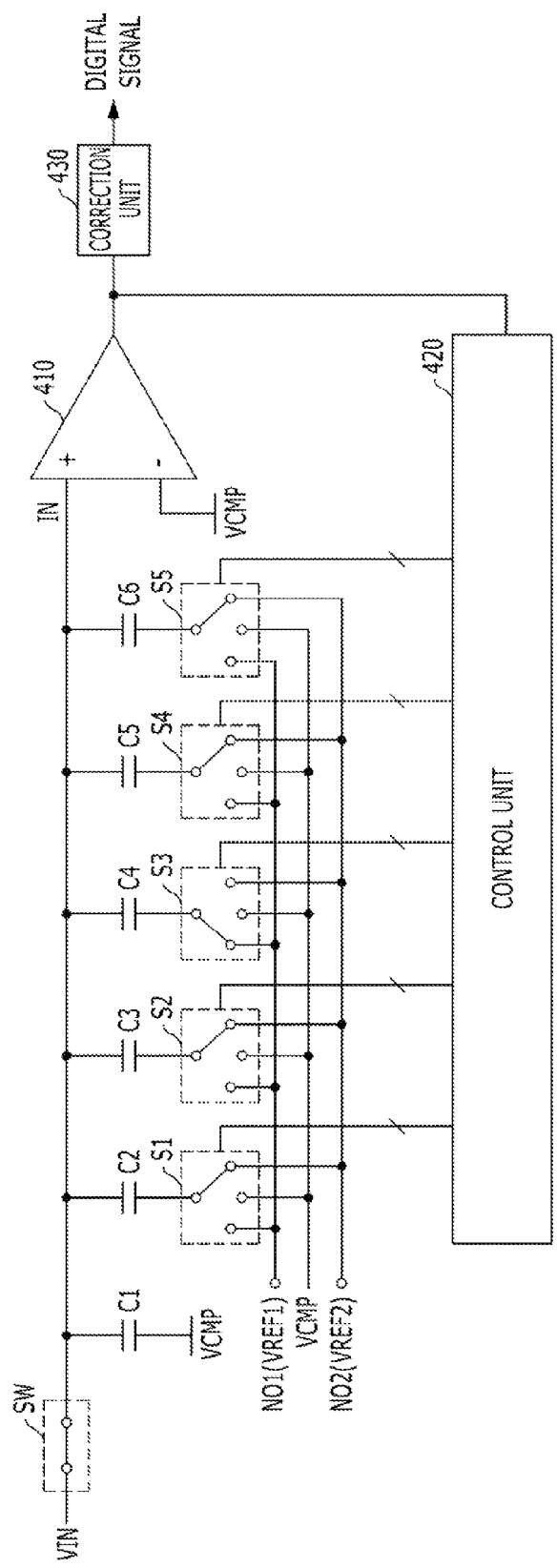
Figure 5D:
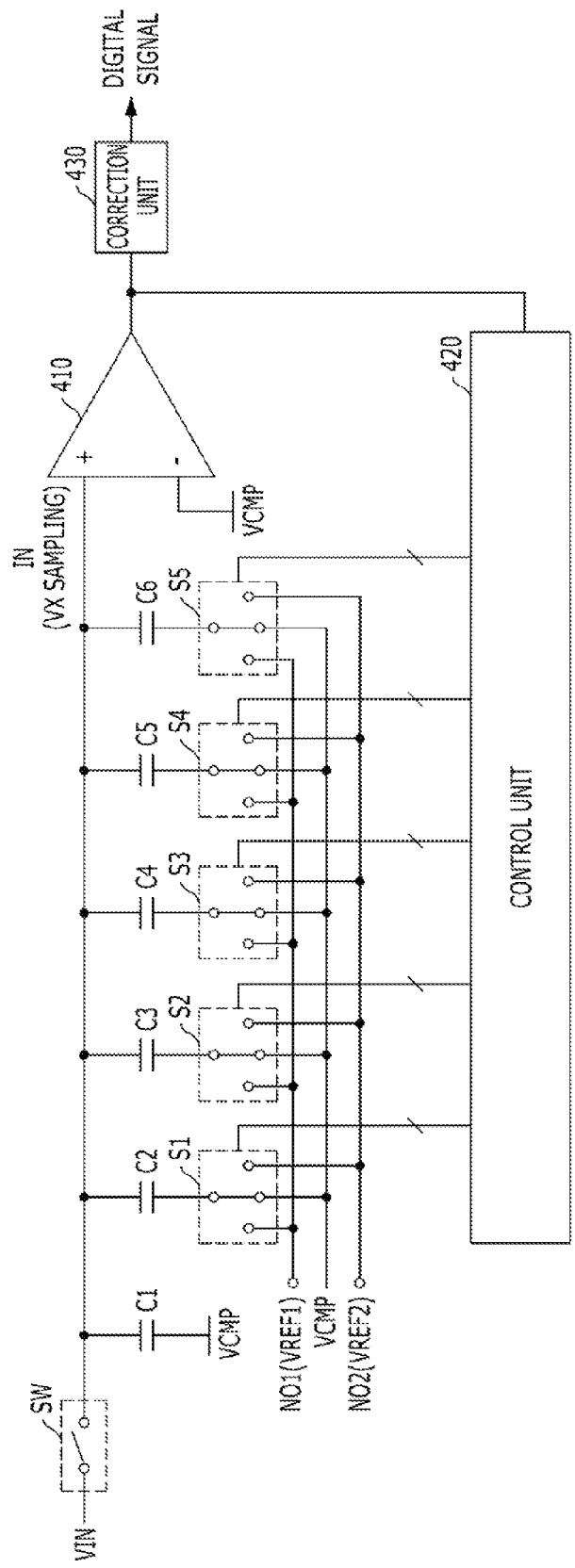

FIG. 5C and FIG. 5D are diagrams for explaining the 2$^{nd}$ sampling operation of the ADC. The ADC samples the residue voltage VX remaining in the input node IN after the 1$^{st}$ conversion operation is completed through the processes illustrated in FIG. 5C and FIG. 5D, and this will be referred to as a resampling voltage VR. A process for sampling the residue voltage VX is substantially identical to that described in FIG. 3C and FIG. 3D.

Figure 5E:
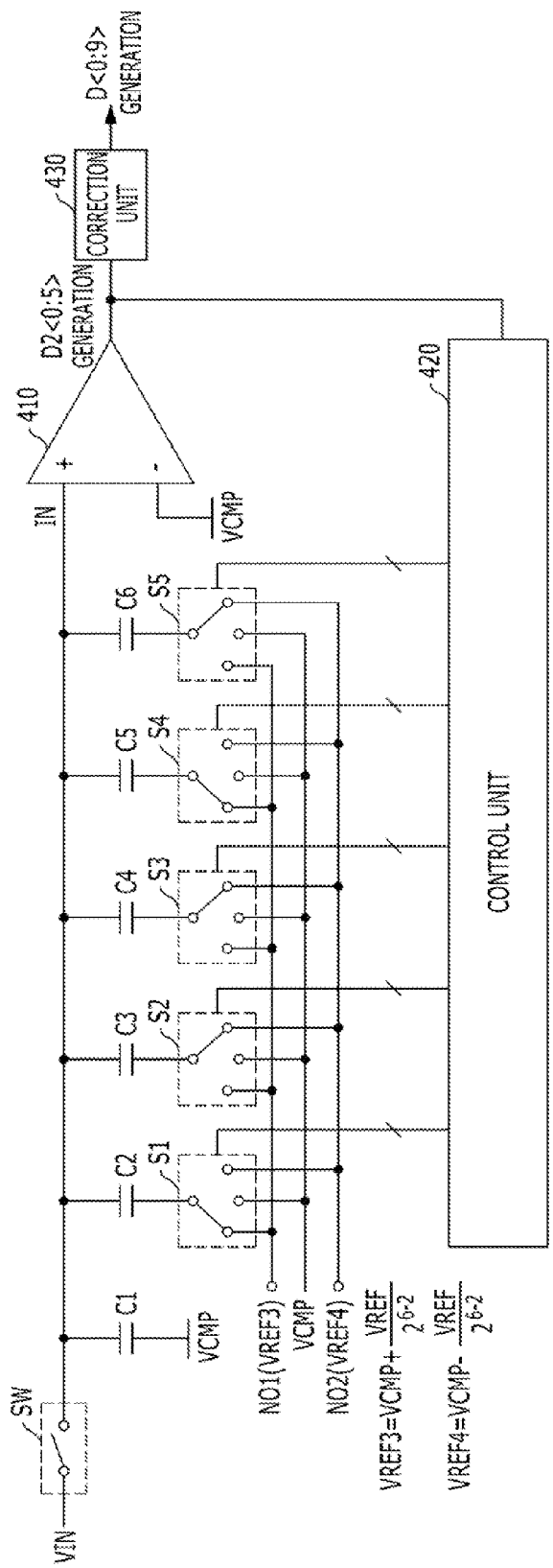

FIG. 5E is a diagram for explaining the 2$^{nd}$ conversion operation. Differently from the ADC of FIG. 3E, in the 2$^{nd}$ conversion operation, the control unit 420 applies to the 1$^{st}$ node NO1 a 3$^{rd}$ reference voltage VREF3 (+VREF/($2^{(N-2)}$)) which is higher than the comparison voltage VCMP by the voltage VREF/($2^{(N-2)}$). The control unit 420 also applies to the 2$^{nd}$ node NO2 a 4$^{th}$ reference voltage VREF4 (-VREF/($2^{(N-2)}$))) which is lower than the comparison voltage VCMP by the voltage VREF/($2^{(N-2)}$). The 3$^{rd}$ reference voltage VREF3 (+VREF/($2^{(N-2)}$))) and the 4$^{th}$ reference voltage VREF4 (-VREF/($2^{(N-2)}$))) of FIG. 5E differ from the 3$^{rd}$ reference voltage VREF3 (+VREF/($2^{(N-1)}$))) and the 4$^{th}$ reference voltage VREF4 (-VREF/($2^{(N-1)}$))) of FIG. 3E, and this is because it is necessary to perform AD conversion once more in a wide range in order to correct the offset of the comparison unit 410.

Except for the difference of the 3$^{rd}$ reference voltage VREF3 and the 4$^{th}$ reference voltage VREF4 between the ADCs of FIGS. 5E and 3E, the process of AD converting the resampling voltage VR to generate the 2$^{nd}$ digital signals D2<0:5> is substantially identical to that described in FIG. 2 and FIG. 3E, a detailed description thereof will be omitted.

It is assumed that the values of the 2$^{nd}$ digital signals D2<0:5> generated in the 2$^{nd}$ conversion operation are equal to the values described in FIG. 2 and FIG. 3E, that is, (D2<5>, D2<4>, D2<3>, D2<2>, D2<1>, and D2<0>)=(1,0,1,1,0,1).

Correction Operation Using 1$^{st}$ Digital Signals D1<0:4> and 2$^{nd}$ Digital Signals D2<0:5>

The correction unit 430 generates corrected digital signals D<0:9> using the 1$^{st}$ digital signals D1<0:4> and the 2$^{nd}$ digital signals D2<0:5>. In more detail, the correction unit 430 adds the 2$^{nd}$ digital signals D2<0:5> to 1$^{st}$ corrected digital signals DC1<0:9> of 2N-2 (2*6-2, that is, 10) bits generated by shifting the 1$^{st}$ digital signals D1<0:4> by bitwise N-1 (6-1 that is, 5), thereby generating the digital signals D<0:9>.

Since (D1<4>, D1<3>D1<2>, D1<1>, and D1<0>)=(0,0,1,0,0), the values of the 1$^{st}$ corrected digital signals DC1<0:9>, that is, (DC1<9>, DC1<8>, DC1<7>, DC1<6>, DC1<5>, DC1<4>, DC1<3>, DC1<2>, DC1<1>, and DC1<0>)=(0,0,1,0,0,0,0,0,0,0). That is, each bit of the 1$^{st}$ digital signals D1<0:N-2> is shifted up by N-1 bitwise and an each value of newly created N-1 bits are filled with '0', so that 1$^{st}$ corrected digital signals D1<0:2N-3> are generated. In other words, upper N-1 bits (DC1<N-1:2N-3>) of 2N-2 bits of the 1$^{st}$ corrected digital signals D1<0:2N-3> are substantially equal to the 1$^{st}$digital signals D1<0:N-2> and lower N-1 bits (DC1<0:N-2>) of 2N-2 bits of the 1$^{st}$ corrected digital signals D1<0:2N-3> are '0'. These values are added to the 2$^{nd}$ digital signals D2<0:5>, so that the digital signals D<0:9> are generated. Accordingly, in the aforementioned example, the values of the digital signals D<0:9>, that is, (DC1<9>, DC1<8>, DC1<7>DC1<6>, DC1<5>, DC1<4>, DC1<3>, DC1<2>, DC1<1>, and DC1<0>)=(0,0,1,0,1,0,1,1,0,1).

The $1^{st}$ digital signals D1<0:N−2> generated in the $1^{st}$ conversion operation and the $2^{nd}$ digital signals D2<0:N−1> generated in the $2^{nd}$ conversion operation are combined with each other, wherein the values of the $1^{st}$ digital signals D1<0:N−2> are shifted so that the least significant bit of the $1^{st}$ digital signals D1<0:N−2> and the most significant bit of the $2^{nd}$ digital signals D2<0:N−1> overlap each other; and added to one another, so that the digital signals D<0:2N−3> are generated. This is expressed by Equation 1 below $$\begin{array}{ccccccc} D1{<}N{-}2{>} & D1{<}N{-}3{>} & \ldots & D1{<}0{>} & 0 & \ldots & 0 \\ + & & & D2{<}N{-}1{>} & D2{<}N{-}2{>} & \ldots & D2{<}0{>} \\ \hline D{<}2N{-}3{>} & D{<}2N{-}4{>} & & \ldots & & & D{<}0{>} \end{array}$$

Equation 1

That is, since the final comparison result of the comparison unit 410 in the $1^{st}$ conversion operation and the $1^{st}$ comparison result of the comparison unit 410 in the $2^{nd}$ conversion operation are obtained through comparison with the comparison voltage VCMP under the assumption that the voltage of the input node IN is in the range of the same voltage, these results are added to each other, so that it is possible to correct the offset of the comparison unit 410.

According to the present invention, the ADC with low-bit resolution is used several times, so that it is possible to convert an analog signal into digital signals with resolution higher than the physical resolution of the ADC. Furthermore, since the operations of the aforementioned voltage selection units are used for the resampling of the residue voltage, no further configuration for the resampling of the residue voltage is not required. Furthermore, the error correction operation is performed using the digital signals generated in the $1^{st}$ and the $2^{nd}$ conversion operations, so that it is possible to correct an error due to the offset of the comparison unit.

In the aforementioned example, the conversion operation is performed twice using the 6-bit ADC to convert the input signal into the 10-bit digital signals. However, the physical resolution of the ADC may vary according to design. Furthermore, the number of the AD conversion operations for higher resolution than physical resolution of ADC may vary. For example, when the conversion operation is performed three times using an ADC with 5-bit physical resolution, the input signal is converted with 4-bit resolution lower than the physical resolution by 1 bit and is resampled in the $1^{st}$ and $2^{nd}$ conversion operations, and the input signal is converted with 5-bit resolution (the physical resolution) in the $3^{rd}$ conversion operation. In relation to the signals generated in this way, the least significant bit of the digital signals generated in the $1^{st}$ conversion and the most significant bit of the digital signals generated in the $2^{nd}$ conversion are added to each other, and the least significant bit of the digital signals generated in the $2^{nd}$ conversion and the most significant bit of the digital signals generated in the $3^{rd}$ conversion are added to each other, so that it is possible to finally generate digital signals of 11 bits (4+4+5−2, where the number of 2 is the number of bits added while overlapping each other).

That is, in the case of performing the resampling with resolution lower than the physical resolution of the ADC by 1 bit, it is possible to perform the iterative conversion using the ADC. During the iteration, the magnitude of the reference voltage needs to be gradually reduced. For example, in the case of N-bit conversion using VREF and −VREF in $1^{st}$ conversion, it is necessary to use VREF/($2^{(N-1)}$) and −REF/($2^{(N-1)}$) in subsequent conversion.

Finally, through correction for adding the least significant bit of digital signals generated in a previous conversion stage, to the most significant bit of digital signals generated in a subsequent conversion stage, so that it is possible to generate digital signals where the offset of the comparison unit 410 has been corrected.

Figure 6:
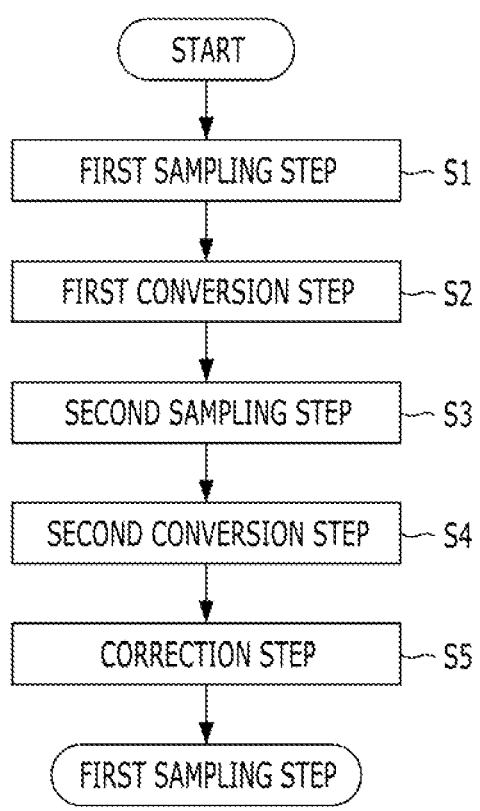
FIG. 6 is a flowchart for explaining an AD conversion method in accordance with an embodiment of the present invention.

FIG. 6 is a flowchart for explaining an AD conversion method in accordance with an embodiment of the present invention.

As illustrated in FIG. 6, the AD conversion method includes a $1^{st}$ sampling step S1, a $1^{st}$ conversion step S2, a $2^{nd}$ sampling step S3, and a $2^{nd}$ conversion step S4. In the $1^{st}$ sampling step S1, the comparison voltage VCMP is applied to the other ends of the capacitors C1 to CN, and the input signal VIN is applied to the input node IN to sample the input signal VIN to the input node IN. In the $1^{st}$ conversion step S2, one of the $1^{st}$ reference voltage VREF1 and the $2^{nd}$ reference voltage VREF2 is selected according to the output of the comparison unit and is sequentially applied to the other ends of the $2^{nd}$ to $N^{th}$ capacitors C2 to CN, so that a part of the input signal VIN is converted into $1^{st}$ digital signals. In the $2^{nd}$ sampling step S3, the input signal VIN is applied to the input node IN to charge the capacitors C1 to CN in the state in which a voltage of the $1^{st}$ reference voltage VREF1 and the $2^{nd}$ reference voltage VREF2, which is not applied in the $1^{st}$ conversion step S2, is applied to the other ends of the $2^{nd}$ to $N^{th}$ capacitors C2 to CN, and the input signal VIN is not applied to the input node IN and the comparison voltage VCMP is applied to the other ends of the $2^{nd}$ to $N^{th}$ capacitors C2 to CN to sample a part of the input signal VIN, which is not converted into the $1^{st}$ digital signals. In the $2^{nd}$ conversion step S4, one of the third reference voltage VREF3 and the fourth reference voltage VREF4 is selected according to the output of the comparison unit and is sequentially applied to the other ends of the $2^{nd}$ to $N^{th}$ capacitors C2 to CN, so that a part of the input signal VIN, which is not converted into the $1^{st}$ digital signals, is converted into $2^{nd}$ digital signals.

The AD conversion method of FIG. 6 may be performed using the ADC of FIG. 2 or the ADC of FIG. 4.

Case o Performing AD Conversion Method According to the Present Invention Using ADC of FIG. 2

The $1^{st}$ sampling step S1 corresponds to the $1^{st}$ sampling operation described in FIG. 2 and FIG. 3A, and the input signal VIN is sampled to the input node IN through the processes described in FIG. 2 and FIG. 3A.

The $1^{st}$ conversion step S2 corresponds to the $1^{st}$ conversion operation described in FIG. 2 and FIG. 3B, and the input signal VIN sampled to the input node IN is converted into the $1^{st}$ digital signals D1<0:N−2> by AD conversion through the processes described in FIG. 2 and FIG. 3B. At this time, the $1^{st}$ reference voltage VREF1 is '+VREF' and the $2^{nd}$ reference voltage VREF2 is '−VREF'.

The $2^{nd}$ sampling step S3 corresponds to the $2^{nd}$ sampling operation described in FIG. 2, FIG. 3C, and FIG. 3D, and the resampling voltage VX having a magnitude substantially the same as that of the residue voltage VX is sampled to the input node IN through the processes described in FIG. 2, FIG. 3C, and FIG. 3D.

The $2^{nd}$ conversion step S4 corresponds to the $2^{nd}$ conversion operation described in FIG. 2 and FIG. 3E, and the resampling voltage VX sampled to the input node IN is converted into the $2^{nd}$ digital signals D2<0:N−1> by AD conversion through the processes described in FIG. 2 and FIG. 3E.

At this time, the third reference voltage VREF3 is '+VREF/($2^{(N-1)}$)' and the fourth reference voltage VREF2 is '−VREF/($2^{(N-1)}$)'.

Last, as described in FIG. 2, the $1^{st}$ digital signals D1<0:N−2> and the $2^{nd}$ digital signals D2<0:N−1> are combined with each other to generate the digital signals D<0:2N−2>.

Case of Performing AD Conversion Method According to the Present Invention Using ADC of FIG. 4

The $1^{st}$ sampling step S1 corresponds to the $1^{st}$ sampling operation described in FIG. 4 and FIG. 5A, and the input signal VIN is sampled to the input node IN through the processes described in FIG. 4 and FIG. 5A.

The $1^{st}$ conversion step S2 corresponds to the $1^{st}$ conversion operation described in FIG. 4 and FIG. 5B, and the input signal VIN sampled to the input node IN is converted into the $1^{st}$ digital signals D1<0:N−2> by AD conversion through the processes described in FIG. 4 and FIG. 5B. At this time, the $1^{st}$ reference voltage VREF1 is '+VREF' and the $2^{nd}$ reference voltage VREF2 is '−VREF'.

The $2^{nd}$ sampling step S3 corresponds to the $2^{nd}$ sampling operation described in FIG. 4, FIG. 5C, and FIG. 5D, and the resampling voltage VX having a magnitude substantially the same as that of the residue voltage VX is sampled to the input node IN through the processes described in FIG. 4, FIG. 5C, and FIG. 5D.

The $2^{nd}$ conversion step S4 corresponds to the $2^{nd}$ conversion operation described in FIG. 4 and FIG. 5E, and the resampling voltage VX sampled to the input node IN is converted into the $2^{nd}$ digital signals D2<0:N−1> by AD conversion through the processes described in FIG. 4 and FIG. 5E. At this time, the third reference voltage VREF3 is '+VREF/($2^{(N-2)}$)' and the fourth reference voltage VREF2 is '−VREF/($2^{(N-2)}$)'.

In the case of performing the AD conversion using the ADC of FIG. 4, the AD conversion method further includes a correction step S5 of performing a correction operation using the $1^{st}$ digital signals D1<0:N−2> and the $2^{nd}$ digital signals D2<0:N−1> and generating the digital signals D<0:2N−3>. In the correction step S5, the least significant bit of the $1^{st}$ digital signals D1<0:N−2> and the most significant bit of the $2^{nd}$ digital signals D2<0:N−1> are added to each other while overlapping each other using the correction method described in FIG. 4, thereby generating the digital signals D<0:2N−3>.

The AD conversion method according to the present invention has effects substantially equal to those of the ADCs of FIGS. 2 and 4.

While the present invention has been described with respect to the specific embodiments, it will be apparent to those skilled in the art that various changes and modifications may be made without departing from the spirit and scope of the invention as defined in the following claims.

What is claimed is:

1. An analog-to-digital converter comprising:
a comparison unit configured to output a result obtained by comparing a voltage of an input node with a comparison voltage;
$1^{st}$ to $N^{th}$ capacitors having one ends connected to the input node, respectively; and
$1^{st}$ to N−$1^{th}$ voltage selection units corresponding to the $2^{nd}$ to $N^{th}$ capacitors, respectively and configured to apply one of a voltages of a $1^{st}$ node, a $2^{nd}$ node, and the comparison voltage to the other ends of the corresponding capacitors, wherein
an input signal is sampled to the input node in a $1^{st}$ sampling operation,
the $1^{st}$ to N−$1^{th}$ voltage selection units select one of the voltages of the $1^{st}$ node and the $2^{nd}$ node according to output of the comparison unit, and convert a part of the input signal into a $1^{st}$ digital signal in a $1^{st}$ conversion operation,
the input signal is applied to the input node in a state where the $1^{st}$ to N−$1^{th}$ voltage selection units select a voltage of the other node which is not selected between the voltages of the $1^{st}$ node and the $2^{nd}$ node in the $1^{st}$ conversion operation,
a remaining part of the input signal, which is not converted into the $1^{st}$ digital signal in the $1^{st}$ conversion operation, is sampled to the input node in a $2^{nd}$ sampling operation, and
the $1^{st}$ to N−$1^{th}$ voltage selection units select one of the voltages of the $1^{st}$ node and the $2^{nd}$ node according to output of the comparison unit, and convert the remaining part of the input signal into a $2^{nd}$ digital signal in a $2^{nd}$ conversion operation.

2. The analog-to-digital converter of claim 1, wherein
the remaining part of the input signal is sampled to the input node in the $2^{nd}$ sampling operation,
with the selection of the comparison voltage by the $1^{st}$ to N−$1^{th}$ voltage selection units,
and without the application of the input signal to the input node,
after the $1^{st}$ to $N^{th}$ capacitors are charged in a state where the $1^{st}$ to N−$1^{th}$ voltage selection units select a voltage of the other node which is not selected between the voltages of the $1^{st}$ node and the $2^{nd}$ node in the $1^{st}$ conversion operation.

3. The analog-to-digital converter of claim 2, wherein
the input signal is sampled to the input node in the $1^{st}$ sampling operation
by the application of the input signal to the input node in a state in which the $1^{st}$ to N−$1^{th}$ voltage selection units select the comparison voltage, and the $1^{st}$ to $N^{th}$ capacitors are charged.

4. The analog-to-digital converter of claim 3, wherein
a digital signal obtained by analog-to-digital converting the input signal is represented with 2N−1 bits,
the $1^{st}$ digital signal is represented with N−1 bits,
the $2^{nd}$ digital signal is represented with N bits,
the $1^{st}$ digital signal corresponds to upper N−1 bits of the digital signal, and
the $2^{nd}$ digital signal corresponds to lower N bits of the digital signal.

5. The analog-to-digital converter of claim 4, further comprising:
a control unit configured to control the $1^{st}$ to N−$1^{th}$ voltage selection units in response to the output of the comparison unit in the $1^{st}$ and $2^{nd}$ conversion operations.

6. The analog-to-digital converter of claim 5, wherein
the control unit applies a $1^{st}$ reference voltage to the $1^{st}$ node while applying a $2^{nd}$ reference voltage to the $2^{nd}$ node in the $1^{st}$ conversion operation, and
the control unit applies a $3^{rd}$ reference voltage to the $1^{st}$ node while applying a $4^{th}$ reference voltage to the $2^{nd}$ node in the $2^{nd}$ conversion operation, wherein
the $1^{st}$ reference voltage is higher than the comparison voltage by a reference voltage,
the $2^{nd}$ reference voltage is lower than the comparison voltage by the reference voltage,
the $3^{rd}$ reference voltage is higher than the comparison voltage by the reference voltage divided by $2^{(N-1)}$, and
the $4^{th}$ reference voltage is lower than the comparison voltage by the reference voltage divided by $2^{(N-1)}$.

7. The analog-to-digital converter of claim 1, wherein
a capacitance of a $K^{th}$ ($2 \le K \le N$) capacitor of the $2^{nd}$ to $N^{th}$ capacitors is $2^{\wedge}(N-2)$ times as large as a capacitance of the $1^{st}$ capacitor.

8. An analog-to-digital converter comprising:
a comparison unit configured to output a result obtained by comparing a voltage of an input node with a comparison voltage;
$1^{st}$ to $N^{th}$ capacitors having one ends connected to the input node, respectively;
$1^{st}$ to $N-1^{th}$ voltage selection units corresponding to $2^{nd}$ to $N^{th}$ capacitors, respectively and configured to apply one of a voltages of a $1^{st}$ node, a $2^{nd}$ node, and the comparison voltage to the other ends of the corresponding capacitors;
a control unit configured to control
the $1^{st}$ to $N-1^{th}$ voltage selection units to sample an input signal to the input node in a $1^{st}$ sampling operation,
the $1^{st}$ to $N-1^{th}$ voltage selection units to select one of a voltages of the $1^{st}$ node and the $2^{nd}$ node according to output of the comparison unit and to generate a $1^{st}$ digital signal in a $1^{st}$ conversion operation,
the input signal to be applied to the input node in a state where the $1^{st}$ to $N-1^{th}$ voltage selection units select a voltage of the other node which is not selected between the voltages of the $1^{st}$ node and the $2^{nd}$ node in the $1^{st}$ conversion operation,
the $1^{st}$ to $N-1^{th}$ voltage selection units to sample a remaining part of the input signal, which is not converted into the $1^{st}$ digital signal in the $1^{st}$ conversion operation, to the input node in a $2^{nd}$ sampling operation, and to select one of the voltages of the $1^{st}$ node and the $2^{nd}$ node according to output of the comparison unit, and to generate a $2^{nd}$ digital signal in a $2^{nd}$ conversion operation; and
a correction unit configured to generate a corrected digital signal of the analog-to-digital converted input signal using the $1^{st}$ digital signal and the $2^{nd}$ digital signal.

9. The analog-to-digital converter of claim 8, wherein
the control unit is configured to control
the remaining part of the input signal to be sampled to the input node in the $2^{nd}$ sampling operation,
with the selection of the comparison voltage by the $1^{st}$ to $N-1^{th}$ voltage selection units,
after the $1^{st}$ to $N^{th}$ capacitors are charged in a state where the $1^{st}$ to $N-1^{th}$ voltage selection units select a voltage of the other node which is not selected between the voltages of the $1^{st}$ node and the $2^{nd}$ node in the $1^{st}$ conversion operation.

10. The analog-to-digital converter of claim 9, wherein,
the control unit is configured to control
the input signal to be sampled to the input node in the $1^{st}$ sampling operation
by the application of the input signal to the input node in a state in which the $1^{st}$ to $N-1^{th}$ voltage selection units select the comparison voltage, and the $1^{st}$ to $N^{th}$ capacitors to be charged.

11. The ADC of claim 10, wherein
the control unit applies a $1^{st}$ reference voltage to the $1^{st}$ node while applying a $2^{nd}$ reference voltage to the $2^{nd}$ node in the $1^{st}$ conversion operation, and
the control unit applies a $3^{rd}$ reference voltage to the $1^{st}$ node while applying a $4^{th}$ reference voltage to the $2^{nd}$ node in the $2^{nd}$ conversion operation, and wherein
the $1^{st}$ reference voltage is higher than the comparison voltage by a reference voltage,
the $2^{nd}$ reference voltage is lower than the comparison voltage by the reference voltage,
the $3^{rd}$ reference voltage is higher than the comparison voltage by the reference voltage divided by $2^{\wedge}(N-1)$, and
the $4^{th}$ reference voltage is lower than the comparison voltage by the reference voltage divided by $2^{\wedge}(N-1)$.

12. The analog-to-digital converter of claim 8, wherein
a capacitance of a $K^{th}$ ($2 \le K \le N$) capacitor of the $2^{nd}$ to $N^{th}$ capacitors is $2^{\wedge}(N-2)$ times as large as a capacitance of the $1^{st}$ capacitor.

13. The analog-to-digital converter of claim 8, wherein
a digital signal obtained by analog-to-digital converting the input signal is represented with $2N-2$ bits,
the $1^{st}$ digital signal is represented with $N-1$ bits, and
the $2^{nd}$ digital signal is represented with N bits.

14. The analog-to-digital converter of claim 13, wherein
the correction unit is configured to add the $2^{nd}$ digital signal to a $1^{st}$ corrected digital signal of $2N-2$ bits generated by shifting the $1^{st}$ digital signal by bitwise $N-1$, and to generate the digital signal.

15. The analog-to-digital converter of claim 14, wherein
upper $N-1$ bits of the $2N-2$ bits of the $1^{st}$ corrected digital signal are substantially equal to the $1^{st}$ digital signal, and lower $N-1$ bits of the $2N-2$ bits of the $1^{st}$ corrected digital signal are '0'.

16. An analog-to-digital conversion method using an analog-to-digital converter including a comparison unit that outputs a result obtained by comparing a voltage of an input node with a comparison voltage and $1^{st}$ to $N^{th}$ capacitors having one ends connected to the input node, respectively, the analog-to-digital conversion method comprising:
a $1^{st}$ sampling step for applying a comparison voltage to the other ends of the $1^{st}$ to $N^{th}$ capacitors, applying an input signal to the input node, and sampling the input signal to an input node;
a $1^{st}$ converting step for selecting one of a $1^{st}$ reference voltage and a $2^{nd}$ reference voltage according to the output of the comparison unit, sequentially applying a selected voltage to the other ends of the $2^{nd}$ to $N^{th}$ capacitors, and converting a part of the input signal into a $1^{st}$ digital signal;
a $2^{nd}$ sampling step for applying the input signal to the input node to charge the $1^{st}$ to $N^{th}$ capacitors in a state in which a voltage of the $1^{st}$ reference voltage and the $2^{nd}$ reference voltage, which is not applied in the $1^{st}$ converting step, is applied to the other ends of the $2^{nd}$ to $N^{th}$ capacitors, and for applying the comparison voltage to the other ends of the $2^{nd}$ to $N^{th}$ capacitors without applying the input signal to the input node, thereby sampling a remaining part of the input signal, which is not converted into the $1^{st}$ digital signal; and
a $2^{nd}$ converting step for selecting one of a $3^{rd}$ reference voltage and a $4^{th}$ reference voltage according to output of the comparison unit, and for sequentially applying a selected voltage to the other ends of the $2^{nd}$ to $N^{th}$ capacitors, thereby converting the remaining part of the input signal into a $2^{nd}$ digital signal.

17. The analog-to-digital conversion method of claim 16, wherein
the $1^{st}$ reference voltage is higher than the comparison voltage by a reference voltage,
the $2^{nd}$ reference voltage is lower than the comparison voltage by the reference voltage,
the $3^{rd}$ reference voltage is higher than the comparison voltage by the reference voltage divided by $2^{\wedge}(N-1)$, and
the $4^{th}$ reference voltage is lower than the comparison voltage by the reference voltage divided by $2^{\wedge}(N-1)$.

18. The analog-to-digital conversion method of claim 17, wherein a digital signal obtained by analog-to-digital converting the input signal is represented with 2N−1 bits, the $1^{st}$ digital signal is represented with N−1 bits, the $2^{nd}$ digital signal is represented with N bits, and upper N−1 bits of the digital signal are substantially equal to the $1^{st}$ digital signal, and lower N bits of the digital signal are substantially equal to the $2^{nd}$ digital signal.

19. The analog-to-digital conversion method of claim 17, further comprising:

a correcting step for generating a corrected digital signal of the analog-to digital converted input signal using the $1^{st}$ digital signal and the $2^{nd}$ digital signal.

20. The analog-to-digital conversion method of claim 19, wherein in the correcting step, the $2^{nd}$ digital signal is added to a $1^{st}$ corrected digital signal of 2N−2 bits generated by shifting the $1^{st}$ digital signal by bitwise N−1, thereby generating the digital signal.

21. The analog-to-digital conversion method of claim 20, wherein upper N−1 bits of the 2N−2 bits of the $1^{st}$ corrected digital signal are substantially equal to the $1^{st}$ digital signal, and lower N−1 bits of the 2N−2 bits of the $1^{st}$ corrected digital signal are '0'.

22. An analog-to-digital converter comprising:

a comparison unit configured to output a result obtained by comparing a voltage of an input node with a comparison voltage;

$1^{st}$ to $N^{th}$ capacitors having one ends connected to the input node, respectively; and $1^{st}$ to N−$1^{th}$ voltage selection units corresponding to the $2^{nd}$ to $N^{th}$ capacitors, respectively and configured to apply one of a $1^{st}$ reference voltage, a $2^{nd}$ reference voltage, and the comparison voltage to the other ends of the corresponding capacitors, or to apply one of a $3^{rd}$ reference voltage, a $4^{th}$ reference voltage, and the comparison voltage to the other ends of corresponding capacitors, wherein an input signal is sampled to the input node in a $1^{st}$ sampling operation, the $1^{st}$ to N−$1^{th}$ voltage selection units select one of the $1^{st}$ reference voltage and the $2^{nd}$ reference voltage according to output of the comparison unit, and convert a part of the input signal into a $1^{st}$ digital signal in a $1^{st}$ conversion operation, the input signal is applied to the input node in a state where the $1^{st}$ to N−$1^{th}$ voltage selection units select a voltage of the other node which is not selected between the voltages of the $1^{st}$ node and the $2^{nd}$ node in the $1^{st}$ conversion operation, a remaining part of the input signal, which is not converted into the $1^{st}$ digital signal in the $1^{st}$ conversion operation, is sampled to the input node in a $2^{nd}$ sampling operation, and the $1^{st}$ to N−$1^{th}$ voltage selection units select one of the $3^{rd}$ reference voltage and the $4^{th}$ reference voltage according to output of the comparison unit, and convert the remaining part of the input signal into a $2^{nd}$ digital signal in a $2^{nd}$ conversion operation.

23. The analog-to-digital converter of claim 22, wherein the $1^{st}$ reference voltage is higher than the comparison voltage by a reference voltage, the $2^{nd}$ reference voltage is lower than the comparison voltage by the reference voltage, the $3^{rd}$ reference voltage is higher than the comparison voltage by the reference voltage divided by $2^{(N-1)}$, and the $4^{th}$ reference voltage is lower than the comparison voltage by the reference voltage divided by $2^{(N-1)}$.

24. An analog-to-digital converter comprising:

a comparison unit configured to output a result obtained by comparing a voltage of an input node with a comparison voltage;

$1^{st}$ to $N^{th}$ capacitors having one ends connected to the input node, respectively;

$1^{st}$ to N−$1^{th}$ voltage selection units corresponding to $2^{nd}$ to $N^{th}$ capacitors, respectively and configured to apply one of a $1^{st}$ reference voltage, a $2^{nd}$ reference voltage, and the comparison voltage to the other ends of the corresponding capacitors, or to apply one of a $3^{rd}$ reference voltage, a $4^{th}$ reference voltage, and the comparison voltage to the other ends of the corresponding capacitors; and a control unit configured to control the $1^{st}$ to N−$1^{th}$ voltage selection units to sample an input signal to the input node in a $1^{st}$ sampling operation, the $1^{st}$ to N−$1^{th}$ voltage selection units to select one of the $1^{st}$ reference voltage and the $2^{nd}$ reference voltage according to output of the comparison unit and to generate a $1^{st}$ digital signal in a $1^{st}$ conversion operation, the input signal to be applied to the input node in a state where the $1^{st}$ to N−$1^{th}$ voltage selection units select a voltage of the other node which is not selected between the $1^{st}$ reference voltage and the $2^{nd}$ reference voltage in the $1^{st}$ conversion operation, the $1^{st}$ to N−$1^{th}$ voltage selection units to sample a remaining part of the input signal, which has not been converted into the $1^{st}$ digital signal in the $1^{st}$ conversion operation, to the input node in a $2^{nd}$ sampling operation, and to select one of the $3^{rd}$ reference voltage and the $4^{th}$ reference voltage according to the output of the comparison unit, and to generate a $2^{nd}$ digital signal in a $2^{nd}$ conversion operation; and a correction unit configured to generate a corrected digital signal of the analog-to-digital converted input signal using the $1^{st}$ digital signal and the $2^{nd}$ digital signal.

25. The analog-to-digital converter of claim 24, wherein the $1^{st}$ reference voltage is higher than the comparison voltage by a reference voltage, the $2^{nd}$ reference voltage is lower than the comparison voltage by the reference voltage, the $3^{rd}$ reference voltage is higher than the comparison voltage by the reference voltage divided by $2^{(N-1)}$, and the $4^{th}$ reference voltage is lower than the comparison voltage by the reference voltage divided by $2^{(N-1)}$.

* * * * *